United States Patent
Ji et al.

(10) Patent No.: US 12,469,631 B2
(45) Date of Patent: Nov. 11, 2025

(54) POWER SUPPLY MODULE

(71) Applicant: Delta Electronics (Shanghai) Co., Ltd., Shanghai (CN)

(72) Inventors: Pengkai Ji, Shanghai (CN); Yuxiang Zeng, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 673 days.

(21) Appl. No.: 17/664,648

(22) Filed: May 23, 2022

(65) Prior Publication Data
US 2022/0392688 A1 Dec. 8, 2022

(30) Foreign Application Priority Data
Jun. 8, 2021 (CN) .......................... 202110638509.9

(51) Int. Cl.
*H01F 27/28* (2006.01)
*H01F 27/24* (2006.01)
(Continued)

(52) U.S. Cl.
CPC ......... *H01F 27/2804* (2013.01); *H01F 27/24* (2013.01); *H02M 3/33569* (2013.01);
(Continued)

(58) Field of Classification Search
CPC ................ H01F 27/2804; H01F 27/24; H01F 2027/2809; H01F 2027/2819; H01F 27/28;
(Continued)

(56) References Cited

U.S. PATENT DOCUMENTS 4,975,671 A * 12/1990 Dirks .................. H01F 17/0033
336/200
6,148,500 A * 11/2000 Krone .................. H01F 41/041
336/200
(Continued)

FOREIGN PATENT DOCUMENTS

CN 202435716 U 9/2012
CN 103430256 A 12/2013
(Continued)

OTHER PUBLICATIONS

Guangcan Li et al., "A High Power Density 48V-12V DCX with 3-D PCB Winding Transformer", pp. 463-467, IEEE, 2020.

*Primary Examiner* — Mang Tin Bik Lian
(74) *Attorney, Agent, or Firm* — CKC & Partners Co., LLC

(57) ABSTRACT

The disclosure provides a magnetic element and a power supply module. The magnetic element includes a first and second magnetic column, a first winding formed by sequentially connecting a first upper metal part, a first left metal part, a first middle metal part and a first right metal part, and a second winding formed by sequentially connecting a second middle metal part, a second left metal part, a first lower metal part and a second right metal part sequentially connected. The first left/middle/right metal parts and the second left/middle/right metal parts are formed on a first substrate having a first upper and lower groove in which the first and second magnetic columns are disposed respectively. The magnetic element and the power supply module in the application use circuit boards having symmetric groove structures, the process is simple, thereby facilitating panel production mode, easy for automation, and lowering cost.

21 Claims, 22 Drawing Sheets

US 12,469,631 B2

Page 2

(51) Int. Cl.
*H02M 3/335* (2006.01)
*H05K 1/14* (2006.01)
*H05K 1/16* (2006.01)

(52) U.S. Cl.
CPC ............. *H05K 1/141* (2013.01); *H05K 1/165* (2013.01); *H01F 2027/2809* (2013.01)

(58) Field of Classification Search
CPC ............. H02M 3/33569; H02M 3/003; H02M 3/33576; H02M 1/0064; H05K 1/141; H05K 1/165; H05K 2201/086
See application file for complete search history.

(56) References Cited

U.S. PATENT DOCUMENTS

| | | | |
|---|---|---|---|
| 6,188,305 B1 * | 2/2001 | Chang | H05K 1/165 336/200 |
| 9,263,177 B1 | 2/2016 | Ikriannikov et al. | |
| 10,347,409 B2 | 7/2019 | Quilici | |
| 2003/0025585 A1 * | 2/2003 | Macerini | H01F 27/2804 29/606 |
| 2006/0152322 A1 * | 7/2006 | Whittaker | H01F 27/2804 336/200 |
| 2006/0176139 A1 | 8/2006 | Pleskach et al. | |
| 2013/0056847 A1 | 3/2013 | Chen et al. | |
| 2015/0061817 A1 * | 3/2015 | Lee | H01F 17/0013 336/221 |
| 2015/0235753 A1 | 8/2015 | Chatani et al. | |
| 2017/0084384 A1 | 3/2017 | Otsubo et al. | |
| 2017/0104419 A1 * | 4/2017 | Zeng | H02M 5/293 |
| 2017/0178794 A1 | 6/2017 | Yan et al. | |
| 2017/0222563 A1 | 8/2017 | Noma et al. | |
| 2017/0345756 A1 | 11/2017 | Yin et al. | |
| 2019/0006077 A1 * | 1/2019 | Quilici | H05K 3/4611 |
| 2019/0131060 A1 * | 5/2019 | Mo | H01F 27/26 |
| 2019/0139703 A1 * | 5/2019 | Mo | H01F 27/24 |
| 2019/0333674 A1 | 10/2019 | Quilici | |
| 2020/0118740 A1 * | 4/2020 | Banba | H01F 41/122 |
| 2020/0143985 A1 | 5/2020 | Cai et al. | |
| 2020/0161042 A1 | 5/2020 | Cai et al. | |
| 2020/0169181 A1 | 5/2020 | Zhou et al. | |
| 2020/0260586 A1 | 8/2020 | Hong et al. | |
| 2021/0005378 A1 * | 1/2021 | Hong | H01F 27/2804 |
| 2022/0130587 A1 * | 4/2022 | Hong | H01F 27/2804 |

FOREIGN PATENT DOCUMENTS

| | | |
|---|---|---|
| CN | 207098945 U | 3/2018 |
| CN | 111145987 A | 5/2020 |
| CN | 111145988 A | 5/2020 |
| CN | 111952293 A | 11/2020 |
| CN | 112530680 A | 3/2021 |
| GB | 2299714 B | 11/1999 |
| PL | 219054 B1 | 3/2015 |

* cited by examiner

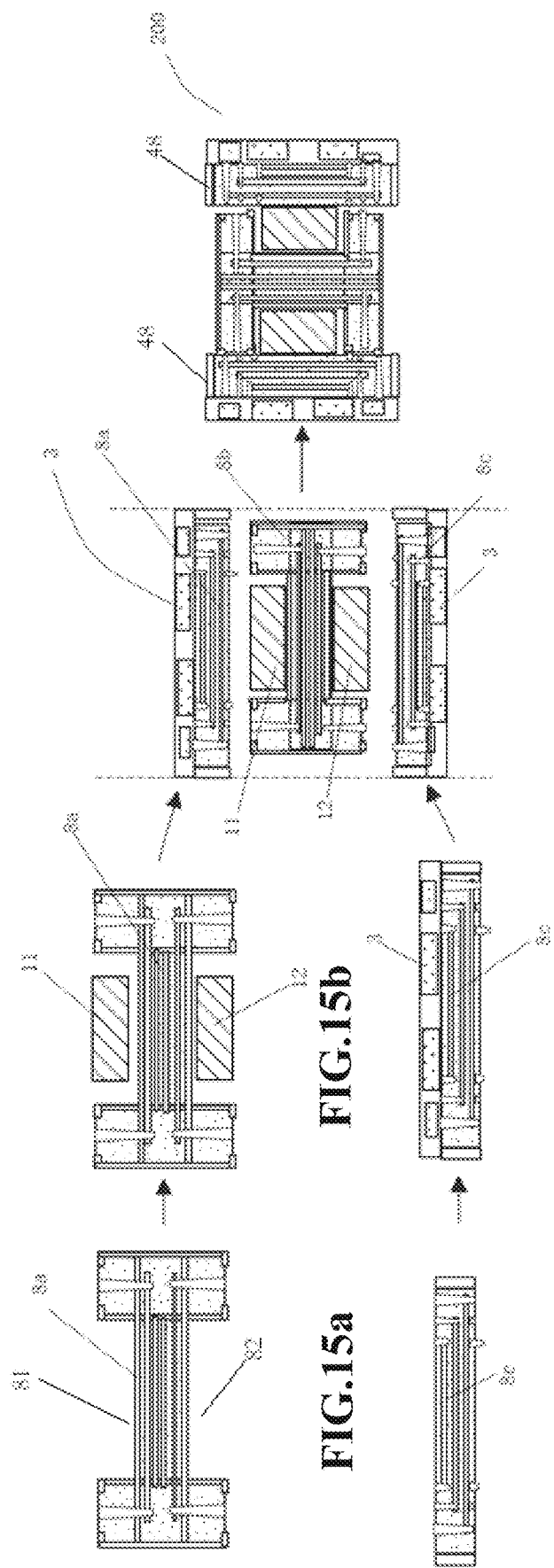

POWER SUPPLY MODULE

CROSS-REFERENCE TO RELATED APPLICATIONS

This non-provisional application claims priority under 35 U.S.C. § 119(a) on Patent Applications No. 202110638509.9 filed in P.R. China on Jun. 8, 2021, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

FIELD

The disclosure relates to the field of power electronic technology, and particularly to a magnetic element and a power supply module.

BACKGROUND

Currently, a market size of cloud (data center) and terminal (mobile phone, Pad, etc.) gets larger, and is increasing rapidly. However, it also faces challenges in various aspects. For example, with increasing of functions of various intelligent ICs, power consumption gets larger, devices on a main board also become more, and the power module shall have a higher power density, or a single power module shall have a larger current output capability. Moreover, with improvement of computing capability of the intelligent ICs, the demand for dynamic performance of the power supply system also gets higher. With increasing power of an intelligent accelerator card and a server, a space for the power supply system on the system board is compressed, and the demand for a higher power density, in particular, a smaller height, is proposed for the power supply system. Currently, a planar transformer structure is often used for the transformer-based DC-DC conversion power supply module, and a complete winding is formed by wiring on a printed circuit board (PCB). Moreover, the winding is a vertical winding, magnetic columns are inserted into inner bores of the winding through assembly, and the magnetic columns and cover are fixed by glue dispensing. The winding of the power supply module with such structure is a vertical winding, currents in the winding are uneven, and loss is large. In addition, an assembly tolerance of such structure (such as, an assembly tolerance of the magnetic columns and the inner bores of the winding on the circuit board) is large, so the structure is not compact, causing a large loss of the winding or the magnetic core. Further, since the cover of the magnetic core are fixed by glue dispensing, which is easy to detach, and thereby affecting reliability. Alternatively, the transformer can also be formed by the way of winding with a copper foil, but the process is complex, and an accuracy of the output terminal is poor, thereby affecting yield.

One defect in the prior art is that if five circuit boards are soldered to form a winding surrounding two magnetic columns through solder paste, and protruding structures on upper and lower end surfaces of the circuit board between the magnetic columns are inserted into openings preset on the circuit board above or below the magnetic core for positioning and soldering, since a tolerance of the soldering process is large, and the soldering pad is large, an accuracy of the entire structure is poor, and a connection tolerance is large, such that the structure is not compact, and a power density is low. In addition, if soldered by solder paste, a transmission loss is large, and reliability is low during a second melting process of system installation, and thus reliability of the power supply module is affected. Furthermore, the process of the structure is tedious, and automation is not easy, thereby not facilitating reducing cost.

Another defect in the prior art is that when one side of the PCB is grooved, and the winding and the magnetic core are disposed in the groove, the structure is asymmetric, and is easy to deform, thereby affecting yield of soldering. The magnetic core forms a magnetic loop along a horizontal direction, and due to limitation of a depth of grooving on the PCB, a magnetic flux density of the magnetic loop is unbalanced, loss is large, and a footprint of the entire structure is large. A surface within the groove is with a three-dimensional structure, the process for forming the winding has a large difficulty. Moreover, a multi-layer winding is difficult to be formed, parasitic inductance is large, cost is high, and performance is to be improved.

Therefore, it is necessary to develop a new solution capable of solving at least some of the above problems.

SUMMARY

To solve the above technical problems, the application provides a magnetic element, including:
  a magnetic core, including:
    a first magnetic column;
    a second magnetic column below the first magnetic column;
  a first winding, including:
    a first upper metal part above the first magnetic column;
    a first left metal part at left side of the first magnetic column;
    a first middle metal part between the first magnetic column and the second magnetic column; and
    a first right metal part at right side of the first magnetic column, the first upper metal part, the first left metal part, the first middle metal part and the first right metal part are sequentially connected; and
  a second winding, including:
    a second middle metal part between the first magnetic column and the second magnetic column;
    a second left metal part at left side of the second magnetic column;
    a first lower metal part below the second magnetic column; and
    a second right metal part at right side of the second magnetic column, the second middle metal part, the second left metal part, the first lower metal part and the second right metal part are sequentially connected,
  wherein the first left metal part, the first middle metal part, the first right metal part, the second middle metal part, the second left metal part and the second right metal part are formed on or in a first substrate, the first substrate has a first upper groove and a first lower groove in which the first magnetic column and the second magnetic column are disposed respectively.

In some embodiments, the first upper metal part is formed on or in a second substrate, and the first lower metal part is formed on or in a third substrate.

In some embodiments, the first substrate, the second substrate and the third substrate are printed circuit boards.

In some embodiments, the first left metal part, the first right metal part, the second left metal part and the second right metal part are conductive vias.

In some embodiments, a surface of the first upper groove is electroplated with a metal.

In some embodiments, the second substrate includes:
a first wiring layer disposed above the first magnetic column; and
a second wiring layer disposed above the first wiring layer, wherein a part of the first upper metal part is on the first wiring layer, and the rest part of the first upper metal part is on the second wiring layer.

In some embodiments, the magnetic element further includes a third winding, the third winding including:
a second upper metal part above the first magnetic column;
a third left metal part at left side of the first magnetic column;
a third middle metal part between the first magnetic column and the second magnetic column; and
a third right metal part at right side of the first magnetic column, the second upper metal part, the third left metal part, the third middle metal part and the third right metal part are sequentially connected,
wherein a part of the second upper metal part is on the first wiring layer, and the rest part of the second upper metal part is on the second wiring layer.

In some embodiments, the magnetic core further includes a first magnetic cover, a second magnetic cover, a third magnetic cover and a fourth magnetic cover, wherein the first magnetic cover and the second magnetic cover are disposed on a front surface and a rear surface of the first magnetic column, the third magnetic cover and the fourth magnetic cover are disposed on a front surface and a rear surface of the second magnetic column, end surfaces of the first magnetic cover, the second magnetic cover, the third magnetic cover and the fourth magnetic cover are inclined, an inclined first air gap is formed between the first magnetic cover and the third magnetic cover, and an inclined second air gap is formed between the second magnetic cover and the fourth magnetic cover.

In some embodiments, the first upper metal part and the first lower metal part are realized by metallization.

In some embodiments, the magnetic element further includes a first bonding layer between the second substrate and the first substrate, and a second bonding layer between the third substrate and the first substrate.

In some embodiments, the first bonding layer is disposed outside a notch of the first upper groove, and the second bonding layer is disposed outside a notch of the first lower groove.

In some embodiments, the second substrate has a second lower groove having a notch facing downward, the third substrate has a second upper groove having a notch facing upward, the second lower groove and the first upper groove are enclosed to form a first accommodation chamber for accommodating the first magnetic column, and the second upper groove and the first lower groove are enclosed to form a second accommodation chamber for accommodating the second magnetic column.

In some embodiments, the magnetic core further includes a third magnetic column and a fourth magnetic column stacked, the third magnetic column is at right side of the first magnetic column, and the fourth magnetic column is at right side of the second magnetic column; the magnetic element further includes:
a fourth winding, including:
a third upper metal part above the third magnetic column;
a fourth left metal part at left side of the third magnetic column;
a fourth middle metal part between the third magnetic column and the fourth magnetic column; and
a fourth right metal part at right side of the third magnetic column, the third upper metal part, the fourth left metal part, the fourth middle metal part and the fourth right metal part are sequentially connected; and
a fifth winding, including:
a fifth middle metal part between the third magnetic column and the fourth magnetic column;
a fifth left metal part at left side of the fourth magnetic column;
a second lower metal part below the fourth magnetic column; and
a fifth right metal part at right side of the fourth magnetic column, the fifth middle metal part, the fifth left metal part, the second lower metal part and the fifth right metal part are sequentially connected,
wherein the fourth left metal part, the fourth middle metal part, the fourth right metal part, the fifth middle metal part, the fifth left metal part and the fifth right metal part are formed on or in the first substrate, the first substrate further has a third upper groove and a third lower groove in which the third magnetic column and the fourth magnetic column are disposed respectively.

In some embodiments, the magnetic element further includes a sixth winding, the sixth winding including:
a fourth upper metal part above the first magnetic column;
a sixth left metal part at left side of the first magnetic column;
a sixth middle metal part between the first magnetic column and the second magnetic column; and
a sixth right metal part at right side of the first magnetic column, the sixth left metal part, the sixth middle metal part and the sixth right metal part formed on or in the first substrate, and the fourth upper metal part, the sixth left metal part, the sixth middle metal part and the sixth right metal part are sequentially connected,
wherein the first winding is used as a primary winding of the magnetic element, and the sixth winding is used as a first secondary winding of the magnetic element.

In some embodiments, the magnetic element further includes a seventh winding, the seventh winding including:
a fifth upper metal part above the first magnetic column;
a seventh left metal part at left side of the first magnetic column;
a seventh middle metal part between the first magnetic column and the right magnetic column; and
a seventh right metal part at right side of the first magnetic column, the seventh left metal part, the seventh middle metal part and the seventh right metal part formed on or in the first substrate, and the fifth upper metal part, the seventh left metal part, the seventh middle metal part and the seventh right metal part are sequentially connected,
wherein the seventh winding is used as a second secondary winding of the magnetic element, and at least a part of the primary winding is between at least a part of the first secondary winding and at least a part of the second secondary winding.

In some embodiments, the first substrate is formed by arranging a second circuit board with a first through hole and a third circuit board with a second through hole on upper and lower surfaces of a first circuit board, or the first substrate is formed by grooving on upper and lower surfaces of a fourth circuit board.

In some embodiments, the magnetic element further includes a plurality of pins disposed on a first end surface of the second substrate and a first end surface of the third substrate, and the first end surface of the second substrate and the first end surface of the third substrate are coplanar.

In some embodiments, the second substrate and the third substrate are electrically connected to the first substrate through a plurality of conductive vias.

In some embodiments, the second substrate and the third substrate are bonded to both sides of the first substrate respectively through bonding layers.

The application further provides a power supply module, including the magnetic element, and further including at least one power switch disposed above the first upper metal part or below the first lower metal part.

In some embodiments, the power supply module further includes a plurality of pins, wherein the first upper metal part is formed on or in a second substrate, the first lower metal part is formed on or in a third substrate, and the plurality of pins are disposed on left end surfaces of the second substrate and the third substrate, or right end surfaces of the second substrate and the third substrate.

BRIEF DESCRIPTION OF THE DRAWINGS

FIGS. 15a-15f are manufacturing flows of one power supply module according to the disclosure.

DETAILED DESCRIPTION

Figure 1:
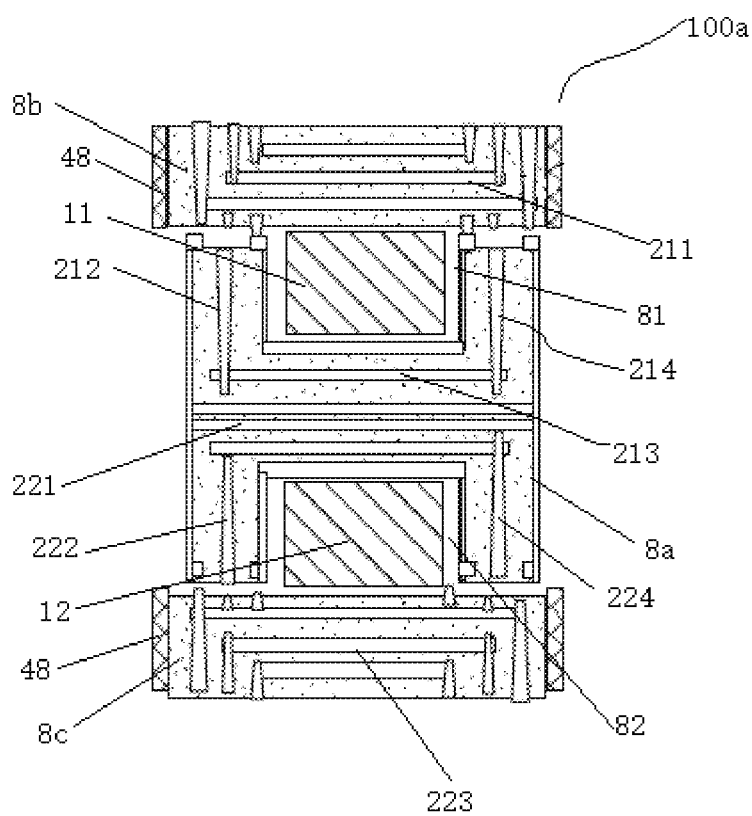
FIG. 1 is a schematic structural view (I) of a magnetic element in a first embodiment of the disclosure.
Figure 2:
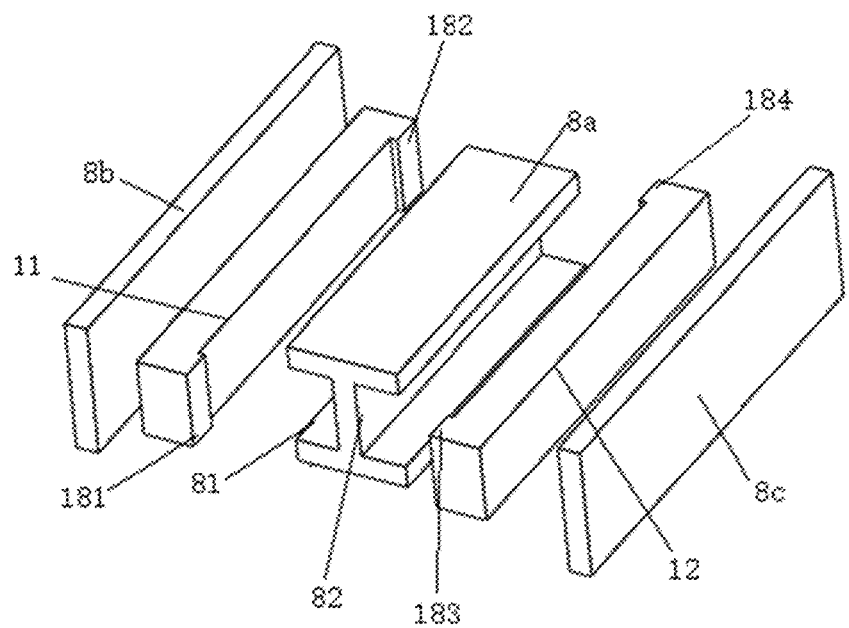
FIG. 2 illustrates an exploded view of FIG. 1.
Figure 3:
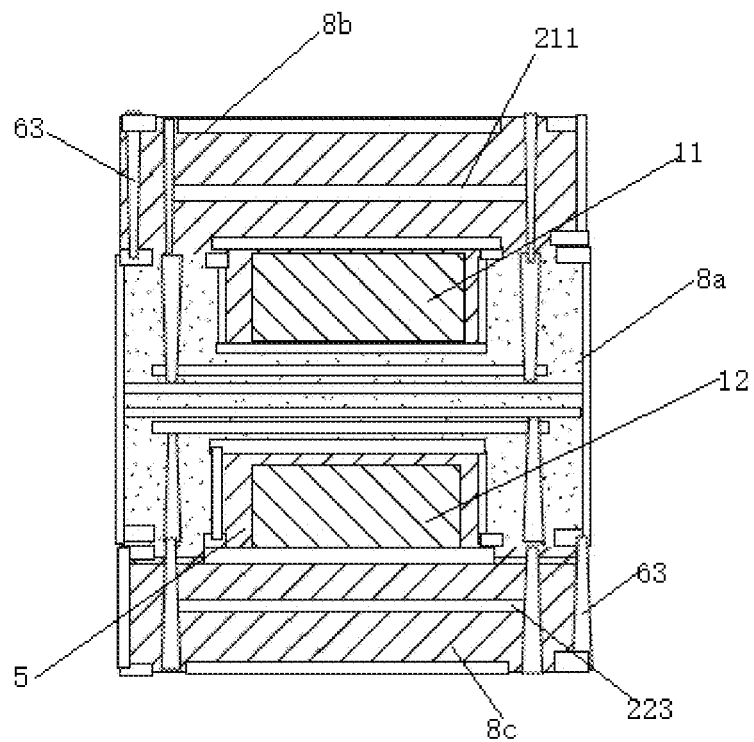
FIG. 3 is a schematic structural view (II) of the magnetic element in the first embodiment of the disclosure.
Figure 4:
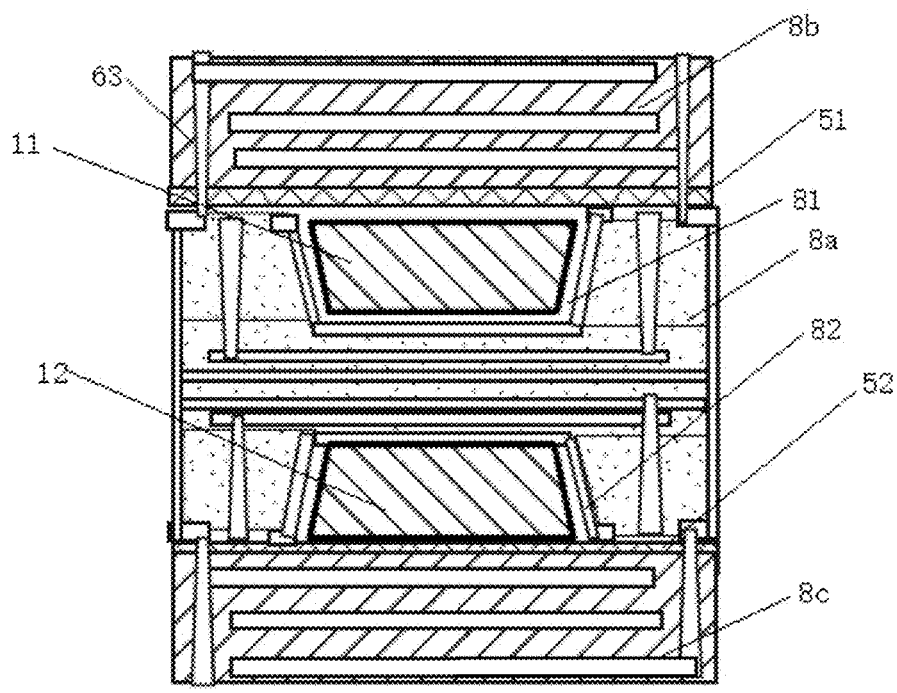
FIG. 4 is a schematic structural view (III) of the magnetic element in the first embodiment of the disclosure.
Figure 5:
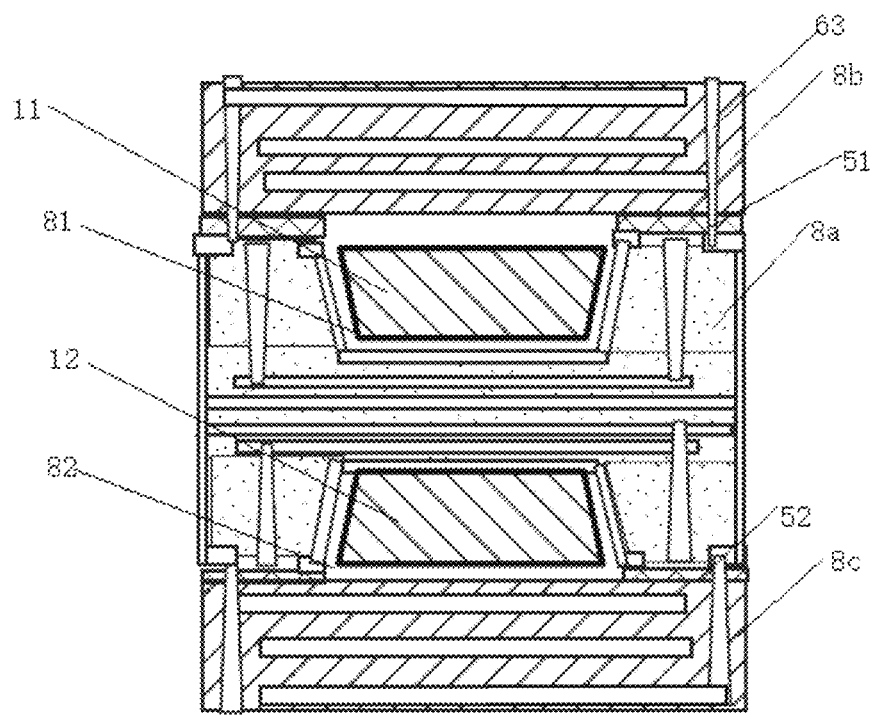
FIG. 5 is a schematic structural view (IV) of the magnetic element in the first embodiment of the disclosure.
Figure 6:
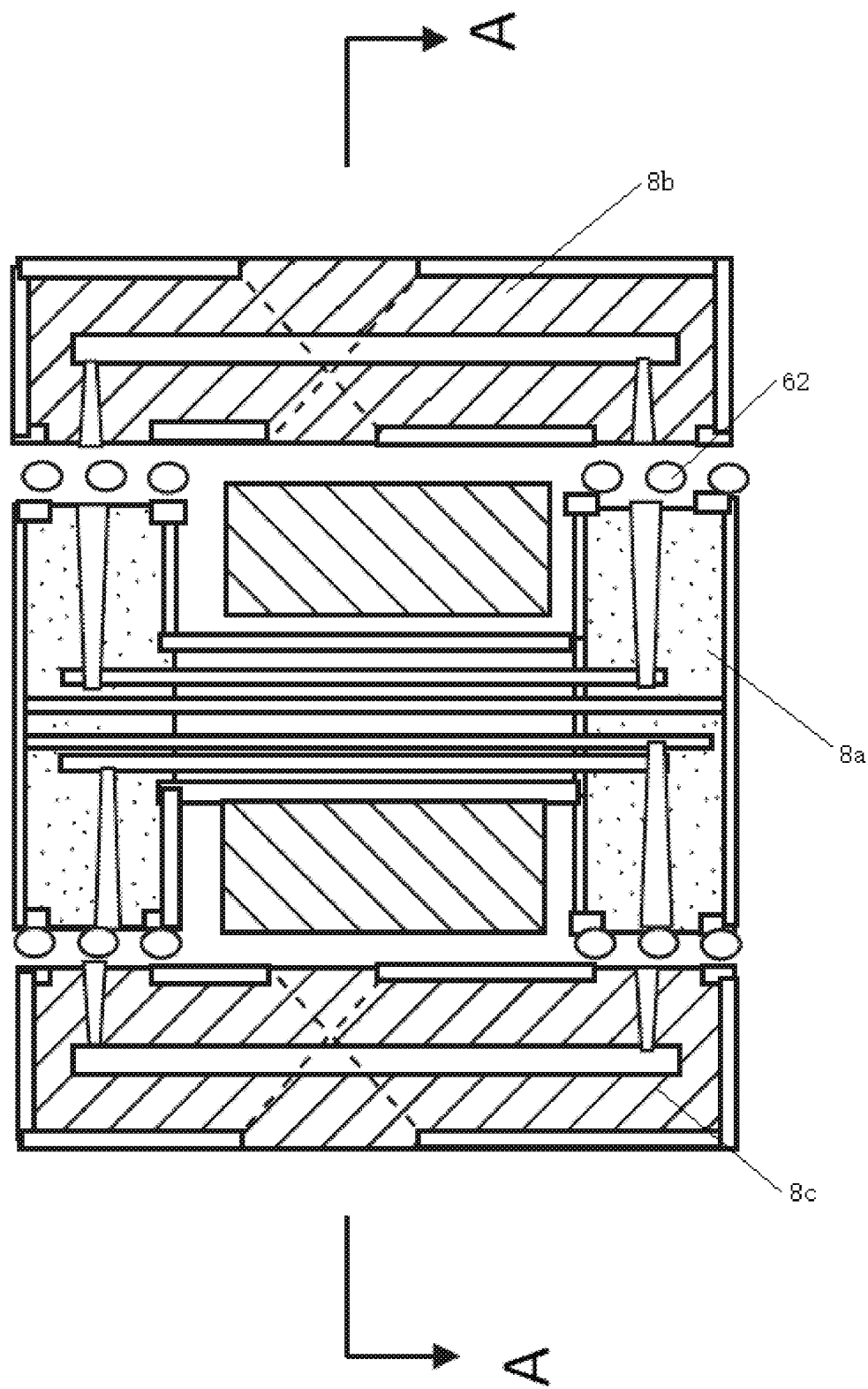
FIG. 6 is a schematic structural view (V) of the magnetic element in the first embodiment of the disclosure.
Figure 7:
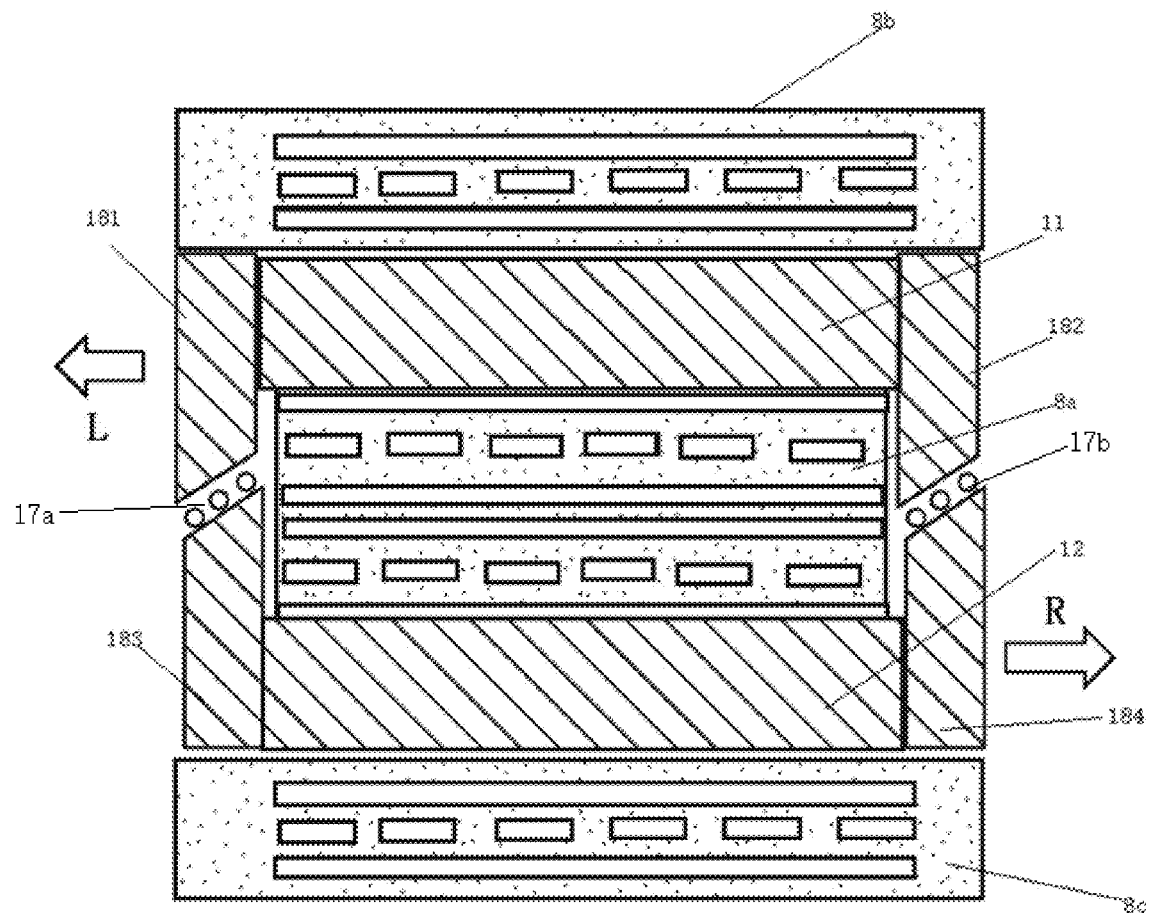
FIG. 7 is a cross-section view along A-A in FIG. 6.

Referring to FIGS. 1 to 7. FIG. 1 is a schematic structural view (I) of a magnetic element in a first embodiment of the disclosure. FIG. 2 illustrates an exploded view of FIG. 1. FIG. 3 is a schematic structural view (II) of the magnetic element in the first embodiment of the disclosure. FIG. 4 is a schematic structural view (III) of the magnetic element in the first embodiment of the disclosure. FIG. 5 is a schematic structural view (IV) of the magnetic element in the first embodiment of the disclosure. FIG. 6 is a schematic structural view (V) of the magnetic element in the first embodiment of the disclosure. FIG. 7 is a cross-section view along A-A in FIG. 6. The application provides a magnetic element 100a, including a first magnetic column 11, a second magnetic column 12, a first winding 21 winded around the first magnetic column 11, and a second winding 22 winded around the second magnetic column. The second magnetic column 12 is below the first magnetic column 11. The first winding 21 includes a first upper metal part 211, a first left metal part 212, a first middle metal part 213 and a first right metal part 214 sequentially connected. The first upper metal part 211 is above the first magnetic column 11, the first left metal part 212 is at left side of the first magnetic column 11, the first middle metal part 213 is between the first magnetic column 11 and the second magnetic column 12, and the first right metal part 214 is at right side of the first magnetic column 11. The second winding 22 includes a second middle metal part 221, a second left metal part 222, a first lower metal part 223 and a second right metal part 224 sequentially connected. The second middle metal part 221 is between the first magnetic column 11 and the second magnetic column 12, the second left metal part 222 is at left side of the second magnetic column 12, the first lower metal part 223 is below the second magnetic column 12, and the second right metal part 224 is at right side of the second magnetic column 12.

The first left metal part 212, the first middle metal part 213, the first right metal part 214, the second middle metal part 221, the second left metal part 222 and the second right metal part 224 are formed on or in a first substrate 8a. The first substrate 8a has a first upper groove 81 and a first lower groove 82 in which the first magnetic column 11 and the second magnetic column 12 are disposed respectively. In some embodiments, a surface of the first upper groove 81 can be electroplated with a metal. The first upper groove 81 and the first lower groove 82 are symmetric on both sides of the first substrate 8a, thereby balancing stresses inside the first substrate 8a, reducing deformation of the first substrate 8a during temperature change, and improving reliability of the magnetic element or the power supply module, or stability of the process.

In this embodiment, referring to FIGS. 1 and 3 simultaneously, the first upper metal part 211 is formed on or in a second substrate 8b, and the first lower metal part 223 is formed on or in a third substrate 8c. The first substrate 8a, the second substrate 8b and the third substrate 8c are printed circuit boards. The first left metal part 212, the first right metal part 214, the second left metal part 222 and the second right metal part 224 are conductive vias. The second substrate 8b and the third substrate 8c are electrically connected to the first substrate 8a only through a plurality of conductive vias 63. A plurality of pins 48 are disposed on a first end surface of the second substrate 8b and a first end surface of the third substrate 8c, and the first end surface of the second substrate 8b and the first end surface of the third substrate 8c are coplanar.

Further, referring to FIG. 3, in this embodiment, the first upper metal part 211 and the first lower metal part 223 are realized by metallization. The way of metallization is as follows. The first magnetic column 11 and the second magnetic column 12 are disposed in the first upper groove 81 and the first lower groove 82 of the first substrate 8a respectively, and then the first magnetic column 11 and the second magnetic column 12 are embedded in an insulated plastic package 5, and the first upper metal part 211 on an upper surface of the insulated plastic package 5 and the first lower metal part 223 on a lower surface of the insulated plastic package 5 are formed by the way of metallization. The first upper metal part 211 is electrically connected to terminals at the left and right side of the first upper groove 81 and on the surface of the substrate 8b through the conductive vias 63, and the first lower metal part 223 is electrically connected to terminals at the left and right side of the first lower groove 82 and on the surface of the substrate 8b through the conductive vias 63. The substrates and the magnetic columns are embedded into the insulated plastic package, and the metal layers of the winding are formed by method like chip embedding, such that the magnetic core element has a more compact structure, a higher power density, and also a higher reliability.

Referring to FIGS. 4 and 5, bonding layers are disposed between the second substrate 8b and the first substrate 8a, and between the third substrate 8c and the first substrate 8a, and include a first bonding layer 51 and a second bonding layer 52. The second substrate 8b is bonded to the first substrate 8a through the first bonding layer 51, and the third substrate 8c is bonded to the first substrate 8a through the second bonding layer 52. The first bonding layer 51 or the second bonding layer 52 can be a prepreg (PP layer), and the prepreg (PP layer) is generally configured for adhesion of two double-sided boards in a multilayer circuit board. After the second substrate 8b is bonded to the first substrate 8a through the first bonding layer 51, and the third substrate 8c is bonded to the first substrate 8a through the second bonding layer 52, the second substrate 8b is electrically connected to corresponding terminals on the surface of the first substrate 8a only through the conductive vias 63 or conductive blind holes penetrating the first bonding layer 51, to form a complete first winding 21, and the third substrate 8c is electrically connected to corresponding terminals on the surface of the first substrate 8a only through the conductive vias 63 or conductive blind holes penetrating the second bonding layer 52, to form a complete second winding 22.

Moreover, as shown in FIG. 5, the first bonding layer 51 is disposed outside a notch of the first upper groove 81, and the second bonding layer 52 is disposed outside a notch of the first lower groove 82. As shown in FIG. 4, the first bonding layer 51 is adhered to a lower surface of the entire second substrate 8b, an upper surface of the first substrate 8a and a surface of the first magnetic column 11, and the second bonding layer 52 is adhered to an upper surface of the third substrate 8c, a lower surface of the first substrate 8a and a surface of the second magnetic column 12. As a preferable embodiment, referring to FIG. 5, the first bonding layer 51 is adhered to a surface of the first substrate 8a and a surface of the second substrate 8b except a region of the first magnetic column 11, and the second bonding layer 52 is adhered to a surface of the first substrate 8a and a surface of the third substrate 8c except a region of the second magnetic column 12. In such way, adhesion of the magnetic columns can be reduced, and stresses of the first magnetic column 11 and the second magnetic column 12 are reduced, and a sectional space of first magnetic column 11 and the second magnetic column 12 is expanded. When the first bonding layer is disposed on the first substrate 8a except the region of the first magnetic column 11, as shown in FIG. 5, a space intended for the first bonding layer 51 above the notch of the groove is now given to the first magnetic column 11, such that a space of the first magnetic column is relatively increased.

Figure 10:
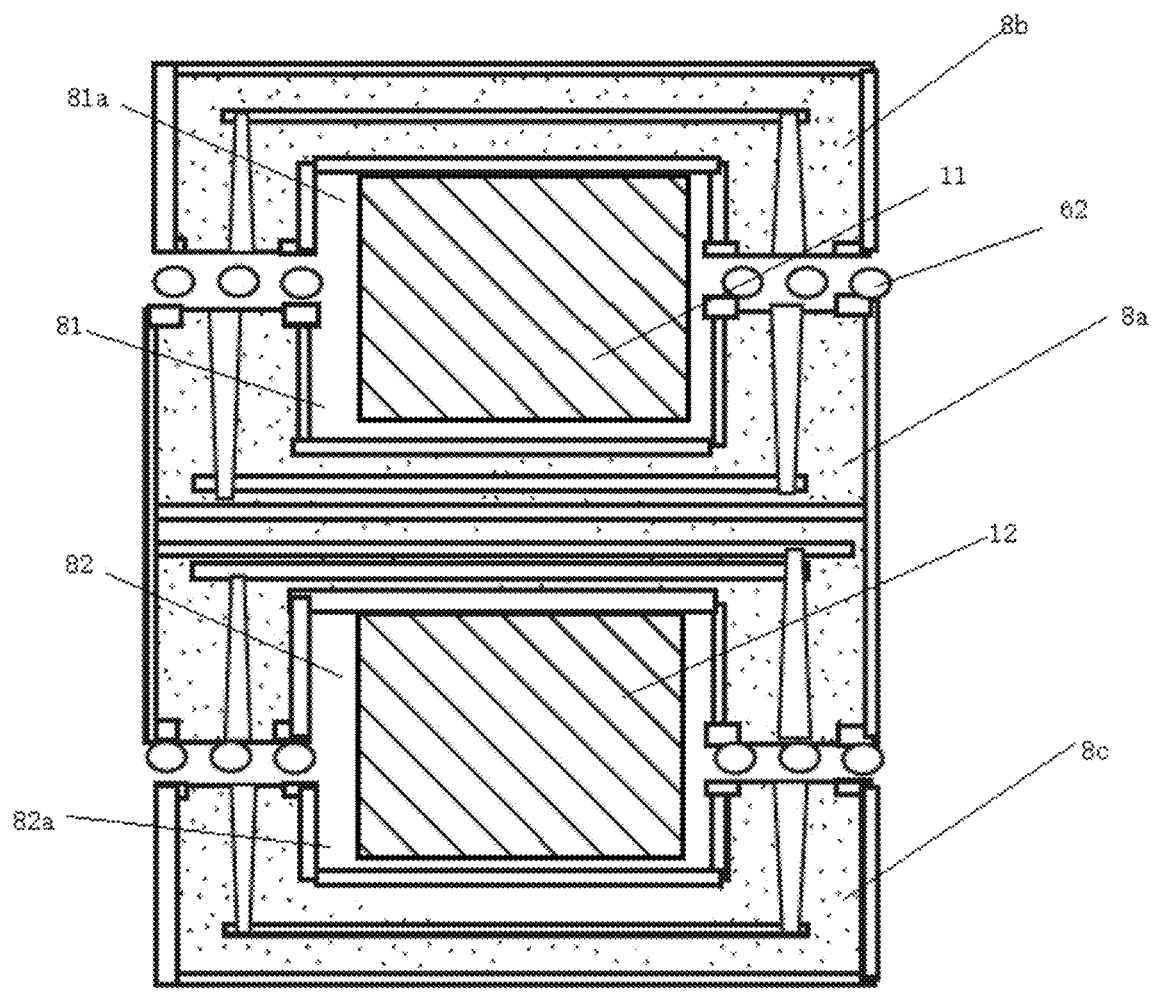
FIG. 10 is a schematic structural view of a magnetic element in a fourth embodiment of the disclosure.

Referring to FIG. 10, as another embodiment, both sides of the second substrate 8b and the third substrate 8a can also be electrically connected by solder paste 62. Similarly, both sides of the third substrate 8c and the first substrate 8a are also electrically connected by the solder paste 62. The connection way is simple, and the process is mature, thereby reducing cost.

Referring to FIGS. 4 and 5 again, in this embodiment, a cross-section of the first upper groove 81 and the first lower groove 82 is a trapezoid, a width of a notch of the first upper groove 81 is greater than a width of a bottom of the first upper groove 81, and a width of a notch of the first lower groove 82 is greater than a width of a bottom of the first lower groove 82. Shape of the first magnetic column 11 is matched with shape of the first upper groove 81, and shape of the second magnetic column 12 is matched with shape of the first lower groove 82. For example, if the first upper groove 81 and the first lower groove 82 are trapezoids, the first magnetic column 11 and the second magnetic column 12 are trapezoids matched with the corresponding grooves. In such way, the first magnetic column 11 can be easily installed in the first upper groove 81 of the first substrate 8a, and the second magnetic column 12 can also be easily installed in the first lower groove 82 of the first substrate 8a, thereby reducing fit clearance between the first magnetic column 11 and the first substrate 8a, and between the second magnetic column 12 and the first substrate 8a, improving a utility rate of space of the magnetic element, and improving efficiency or a power density of the magnetic element.

FIG. 2 illustrates an exploded view of FIG. 1. The first magnetic column 11 and the second magnetic column 12 form a complete magnetic loop through magnetic cover 18 at ends of the first magnetic column 11 and the second magnetic column 12. The magnetic cover 18 includes a first magnetic cover 181, a second magnetic cover 182, a third magnetic cover 183 and a fourth magnetic cover 184, the first magnetic cover 181 and the second magnetic cover 182 are disposed on a front surface and a rear surface of the first magnetic column 11, and the third magnetic cover 183 and the fourth magnetic cover 184 are disposed on a front surface and a rear surface of the second magnetic column 12. Referring to FIG. 7, a first air gap 17a is formed between the first magnetic cover 181 and the third magnetic cover 183, and a second air gap 17b is formed between the second magnetic cover 182 and the fourth magnetic cover 184. In this embodiment, in order to better adjust the first magnetic column 11 and the second magnetic column 12 in a thickness direction, the magnetic cover 18 may be slightly modified. Referring to FIG. 7, FIG. 7 is a cross-section view along A-A in FIG. 6. As shown in FIG. 7, end surfaces of the first magnetic cover 181, the second magnetic cover 182, the third magnetic cover 183 and the fourth magnetic cover 184 are inclined. An inclined first air gap 17a is formed between the first magnetic cover 181 and the third magnetic cover 183, and an inclined second air gap 17b is formed between the second magnetic cover 182 and the fourth magnetic cover 184. The first magnetic column 11 and the second magnetic column 12 are connected by the air gaps 17a and 17b to form a complete magnetic loop. The first air gap and the second air gap are inclined. When the first magnetic column 11 and the second magnetic column 12 form the magnetic loop, if sizes of the air gaps 17a and 17b do not meet expectations due to a thickness tolerance and/or other tolerances of the first substrate 8a, a relative position of the first magnetic column 11 or the second magnetic column 12 can be slightly adjusted in a horizontal direction. The horizontal direction refers to a direction parallel to the first substrate 8a, or the second substrate 8b, or the third substrate 8c. For example, if the air gaps are smaller than expected, the second magnetic column 12 keeps still, and the first magnetic column 11 is shifted to left in a direction indicated by an arrow L. If the air gaps 17 are larger than expected, the second magnetic column 12 keeps still, and the first magnetic column 11 is shifted to right in a direction indicated by an arrow R. The inclined air gaps can be flexibly adjusted in the case of ensuring the first magnetic column 11, the first substrate 8a and the second magnetic column 12 to be closely installed. Accordingly, a power density of the power supply module can be improved, and the air gaps of the magnetic loop can also be adjusted conveniently. The magnetic cover 18 can be integrated with the first magnetic column 11 and/or the second magnetic column 12.

It shall be noted that the first upper groove 81 and the first lower groove 82 on the first substrate 8a are completely symmetric, and the middle metal part of the first substrate 8a can also be symmetrically arranged up and down, or can be asymmetrically arranged, but the disclosure is not limited thereto.

Figure 8:
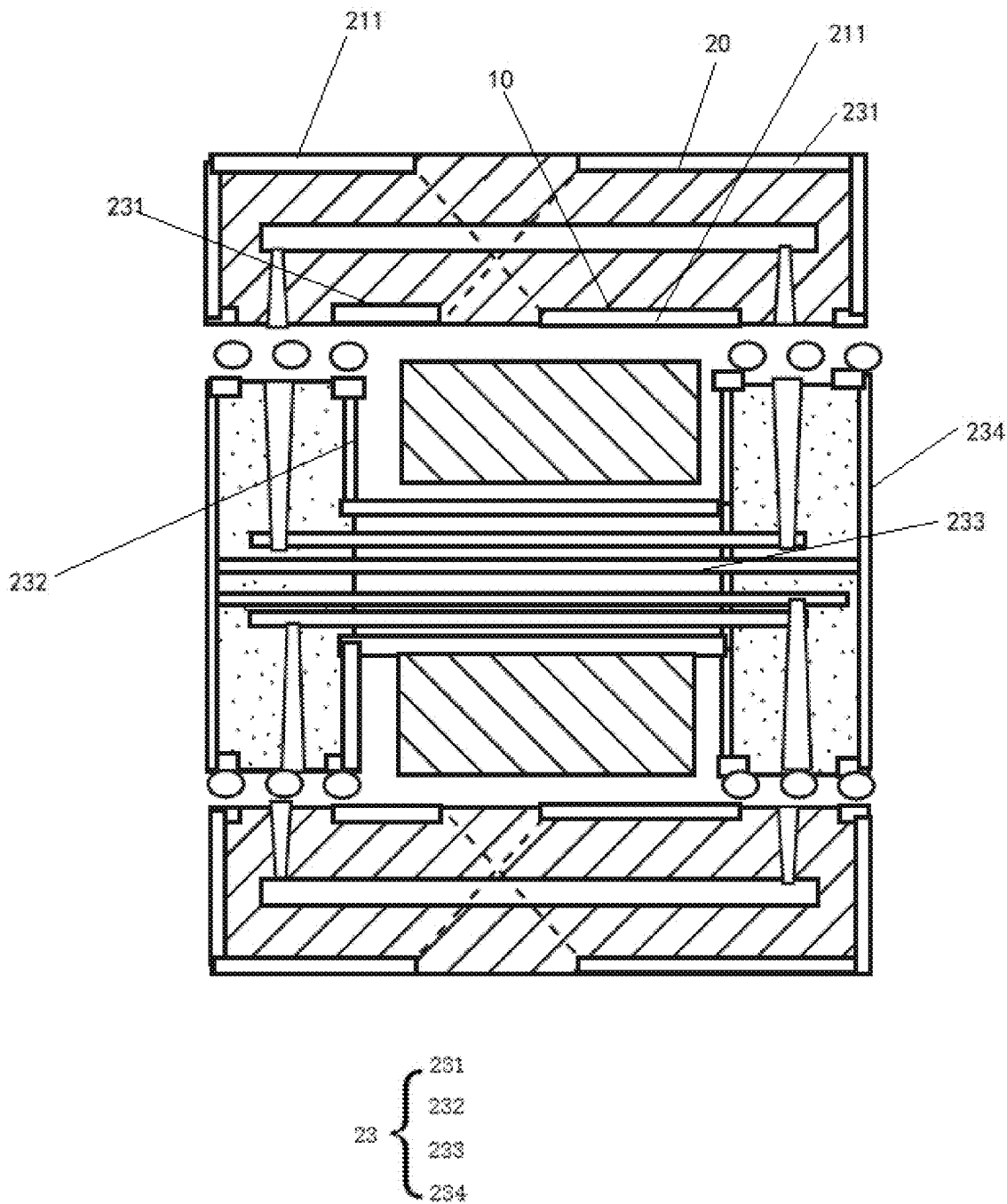
FIG. 8 is a schematic structural view of a magnetic element in a second embodiment of the disclosure.

FIG. 8 is a schematic structural view of a magnetic element in a second embodiment of the disclosure. This embodiment differs from the first embodiment in that a third winding 23 is further winded around the first magnetic column 11. The third winding 23 includes a second upper metal part 231, a third left metal part 232, a third middle metal part 233 and a third right metal part 234 sequentially connected. The second upper metal part 231 is above the first magnetic column 11, the third left metal part 232 is at left side of the first magnetic column 11, the third middle metal part 233 is between the first magnetic column 11 and the second magnetic column 12, and the third right metal part 234 is at right side of the first magnetic column 11.

In this embodiment, the first substrate 8a or the second substrate 8b or the third substrate 8c is provided with multiple wiring layers, the first upper metal part 211 is on the multiple wiring layers of the second substrate 8b, and the second upper metal part 231 is also on the multiple wiring layers of the second substrate 8b. Referring to FIG. 8, as shown in FIG. 8, the second substrate 8b includes a first wiring layer 10 and a second wiring layer 20. Structure of the third substrate 8c is similar with the structure of the wiring layers of the second substrate 8b, and the details are not described here. It shall be noted that in this embodiment, the first wiring layer 10 and the second wiring layer 20 refer to metal wiring on the printed circuit board, a part of metal wiring functions as a part of the first winding 21 or the second winding, and other metal wiring function as other circuits. The first wiring layer 10 is disposed above the first magnetic column 11, and the second wiring layer 20 is disposed above the first wiring layer. Explanations are made for layout of the first winding 21 and the third winding on or in the second substrate 8b. A part of the first upper metal part 211 is on the first wiring layer 10, and the rest part of the first upper metal part 211 is on the second wiring layer 20. A part of the second upper metal part 231 is on the first wiring layer, and the rest part of the second upper metal part 231 is on the second wiring layer. That is, a part of the first winding 21 is on the first wiring layer 10, a part of the first winding 21 is on the second wiring layer 20, a part of the third winding 23 is on the first wiring layer 10, and a part of the third winding 23 is on the second wiring layer 20. Other windings can also be arranged on different wiring layers, and the details are not described here. The first substrate 8a also has wring layers, and a part of the wiring layers on the first substrate 8a can also participate in forming the first winding 21, the second winding 22 and the third winding 23.

Figure 9A:
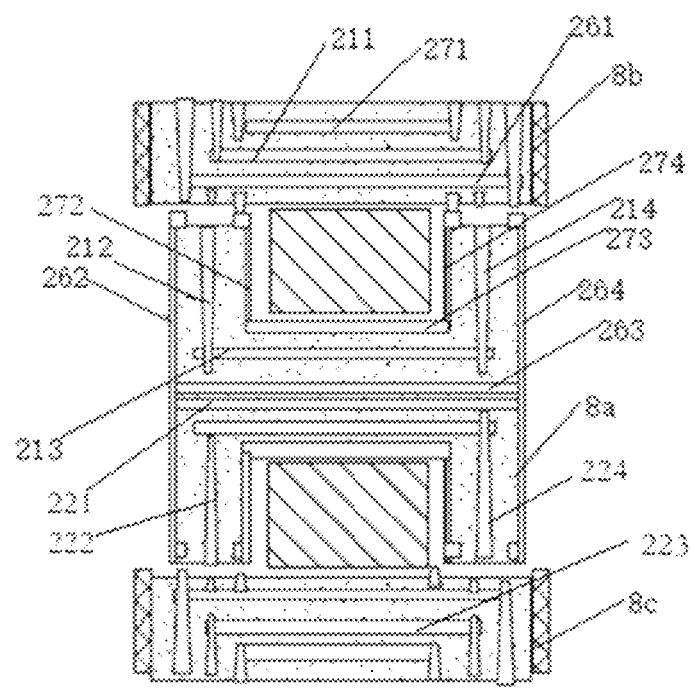
FIG. 9A is a schematic structural view (I) of a magnetic element in a third embodiment of the disclosure.
Figure 9B:
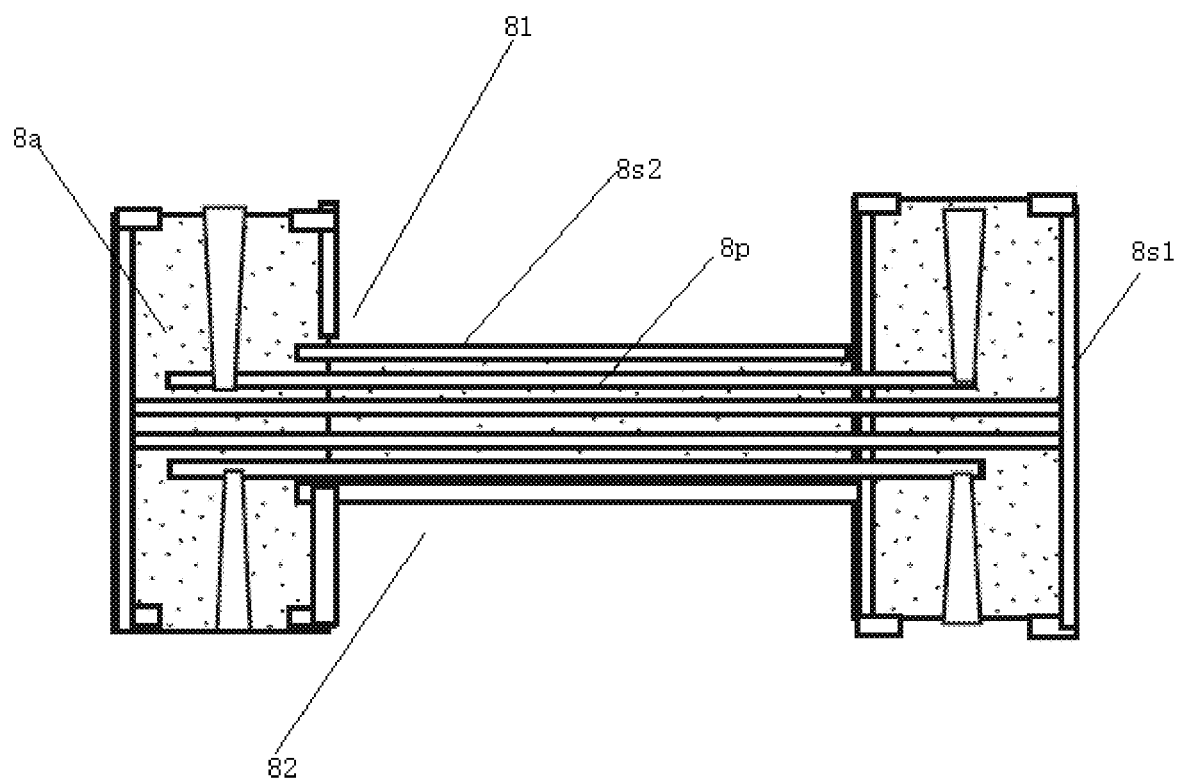
FIG. 9B is a schematic structural view of a first substrate.
Figure 9C:
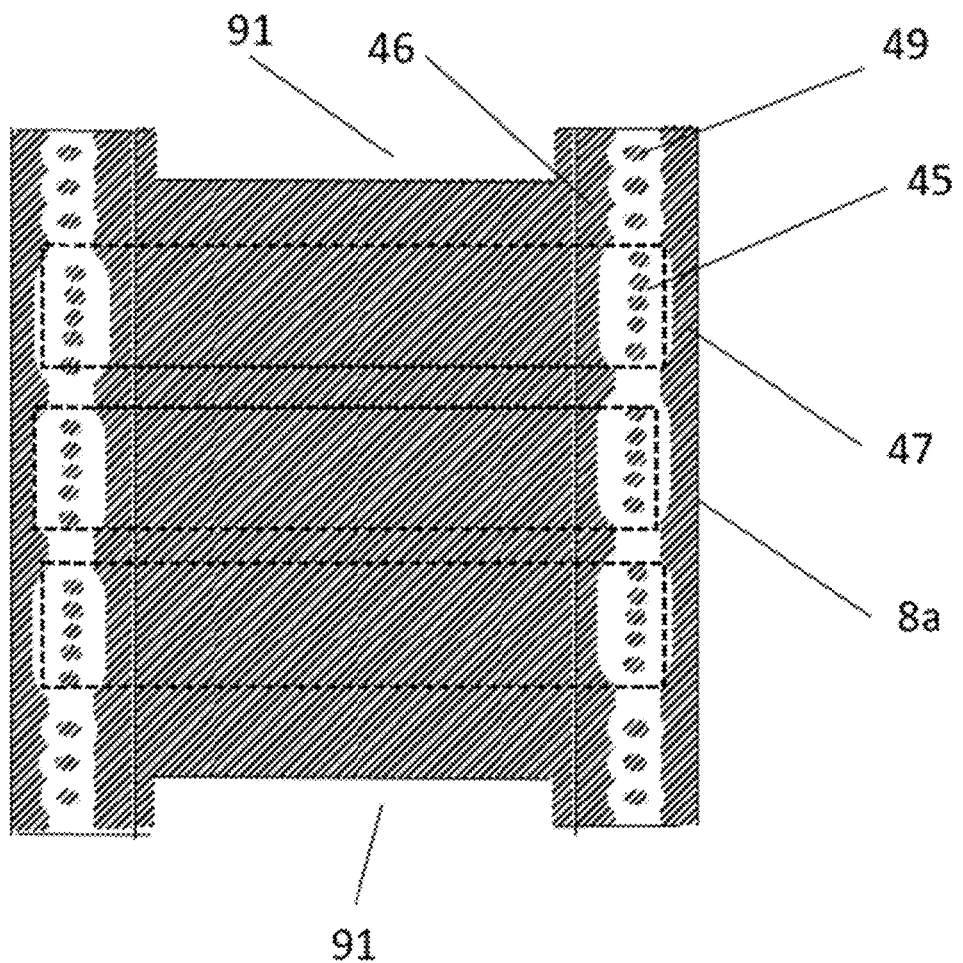
FIG. 9C is a top view of the first substrate shown in FIG. 9B.
Figure 9D:
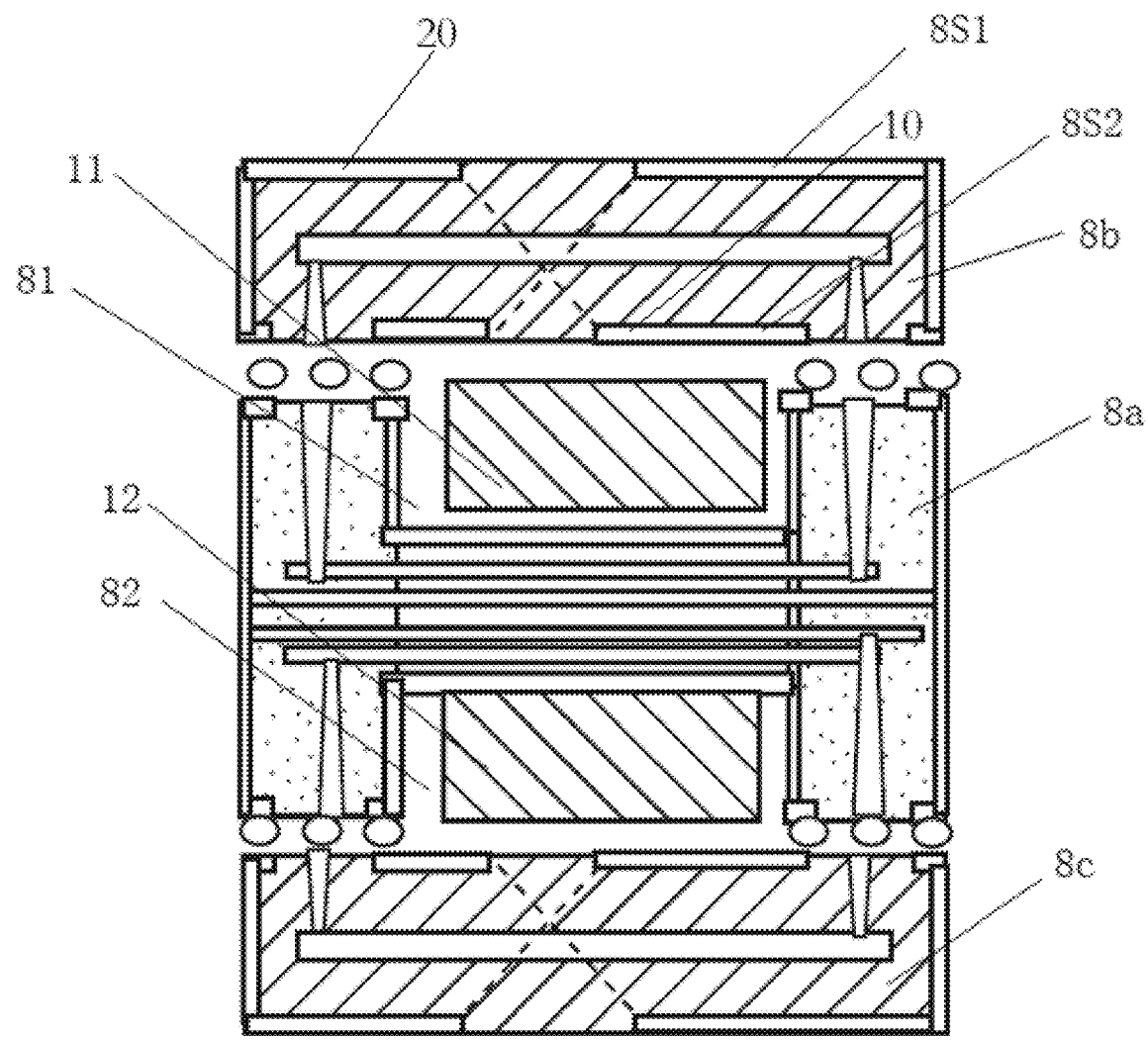
FIG. 9D is a schematic structural view (II) of the magnetic element in the third embodiment of the disclosure.

FIG. 9A is a schematic structural view (I) of a magnetic element in a third embodiment of the disclosure, FIG. 9B is a schematic structural view of a first substrate, FIG. 9C is a top view of the first substrate shown in FIG. 9B, and FIG. 9D is a schematic structural view (II) of the magnetic element in the third embodiment of the disclosure. Structure of the magnetic element in this embodiment is similar with that of the magnetic element in the first embodiment, and the same reference numerical indicates the same element and function, so the details are not described here. The magnetic element provided in this embodiment includes a first magnetic column 11, a second magnetic column 12, a first winding 21, a sixth winding 26 and a seventh winding 27 winded around the first magnetic column 11, and a second winding 22 winded around the second magnetic column 12. Structures of the first winding 21 and the second winding 22 in this embodiment and in the first embodiment are completely the same. The second magnetic column 12 is below the first magnetic column 11. The sixth winding 26 includes a fourth upper metal part 261, a sixth left metal part 262, a sixth middle metal part 263 and a sixth right metal part 264 sequentially connected. The sixth left metal part 262, the sixth middle metal part 263 and the sixth right metal part 264 are formed on or in the first substrate 8a. The fourth upper metal part 261 is above the first magnetic column 11, the sixth left metal part 262 is at left side of the first magnetic column 11, the sixth middle metal part 263 is between the first magnetic column 11 and the second magnetic column 12, and the sixth right metal part 264 is at right side of the first magnetic column 11.

Moreover, the seventh winding 27 includes a fifth upper metal part 271, a seventh left metal part 272, a seventh middle metal part 273 and a seventh right metal part 274 sequentially connected. The seventh left metal part 272, the seventh middle metal part 273 and the seventh right metal part 274 are formed on or in the first substrate 8a. The fifth upper metal part 271 is above the first magnetic column 11, the seventh left metal part 272 is at left side of the first magnetic column 11, the seventh middle metal part 273 is between the first magnetic column 11 and the right magnetic column 12, and the seventh right metal part 274 is at right side of the first magnetic column 11.

Referring to FIG. 9B, the first winding 21 can be used as a primary winding $8p$ of the magnetic element, the sixth winding 21 can be used as a first secondary winding $8s1$ of the magnetic element, and the seventh winding 27 can be used as a second secondary winding $8s2$ of the magnetic element. At least a part of the primary winding $8p$ is between at least a part of the first secondary winding 8s1 and at least a part of the second secondary winding 8s2, and a part of the second secondary winding 8s2 is disposed on a surface of the first upper groove 81.

Referring to FIG. 9C, FIG. 9C illustrates terminals disposed on left and right sides of the first upper groove 81 of the first substrate 8a. The terminals include a primary terminal 45, a first secondary terminal 47 and a second secondary terminal 46. The second secondary terminal 46 is connected to the second secondary winding 8S2, the first secondary terminal 47 is connected to the first secondary winding 8S1, and the primary terminal 45 is connected to the primary winding 8p. Other terminals 49, such as, input and output terminals, and signal terminals, can also be disposed on left and right sides of the first upper groove 81 and the first lower groove 82 of the first substrate 8a. As illustrated in FIG. 9C, openings 91 can also be disposed on upper and lower sides of the first upper groove 81 and the first lower groove 82 for accommodating the magnetic cover 18.

In addition, as shown in FIG. 9D, the second substrate 8b is provided with the first wiring layer 10 adjacent to the first upper groove 81, and the second wiring layer 20 above the first wiring layer 10. Each of the first secondary winding 8S1 and the second secondary winding 8S2 can be arranged on different wiring layers. A part of the first secondary winding 8s1 is on the second wiring layer 20, and another part is on the first wiring layer 10. Similarly, a part of the second secondary winding 8s2 is on the first wiring layer 10, and another part is on the second wiring layer 20. In such way, lengths of paths of the first secondary winding 8s1 and the second secondary winding 8s2 are more consistent, thereby improving consistency of impedance between the secondary windings of the multiple circuits.

Referring to FIG. 10, FIG. 10 is a schematic structural view of a magnetic element in a fourth embodiment of the disclosure. This embodiment differs from the first embodiment in that the second substrate 8b and the third substrate 8c are provided with grooves on one side facing the first substrate 8a. Specifically, the second substrate 8b has a second lower groove 81a having a notch facing downward, and the third substrate 8c has a second upper groove 82a having a notch facing upward. The second lower groove 81a and the first upper groove 81 are enclosed to form a first accommodation chamber for accommodating the first magnetic column 11, and the second upper groove 82a and the first lower groove 82 are enclosed to form a second accommodation chamber for accommodating the second magnetic column 12. The grooves on the second substrate 8b and the third substrate 8c are cooperated with the grooves on the first substrate 8a to enlarge a space for placing the magnetic columns, such that the magnetic core with a larger volume can be placed. For example, thicknesses of the first magnetic column 11 and the second magnetic column 12 are increased by disposing grooves on the second substrate 8b and the third substrate 8c without increasing a thickness of the first substrate 8a, thereby reducing loss of the magnetic loop, and improving efficiency. Depths of the grooves (depths of the first upper groove 81 and the first lower groove 82 in FIG. 10) of the first substrate 8a is generally limited by process of the circuit board, and a desired thickness of the magnetic columns can be achieved by disposing grooves on the second substrate 8b and the third substrate 8c without increasing thickness of the first substrate 8a, and this embodiment can expand application range of the disclosure.

Figure 11:
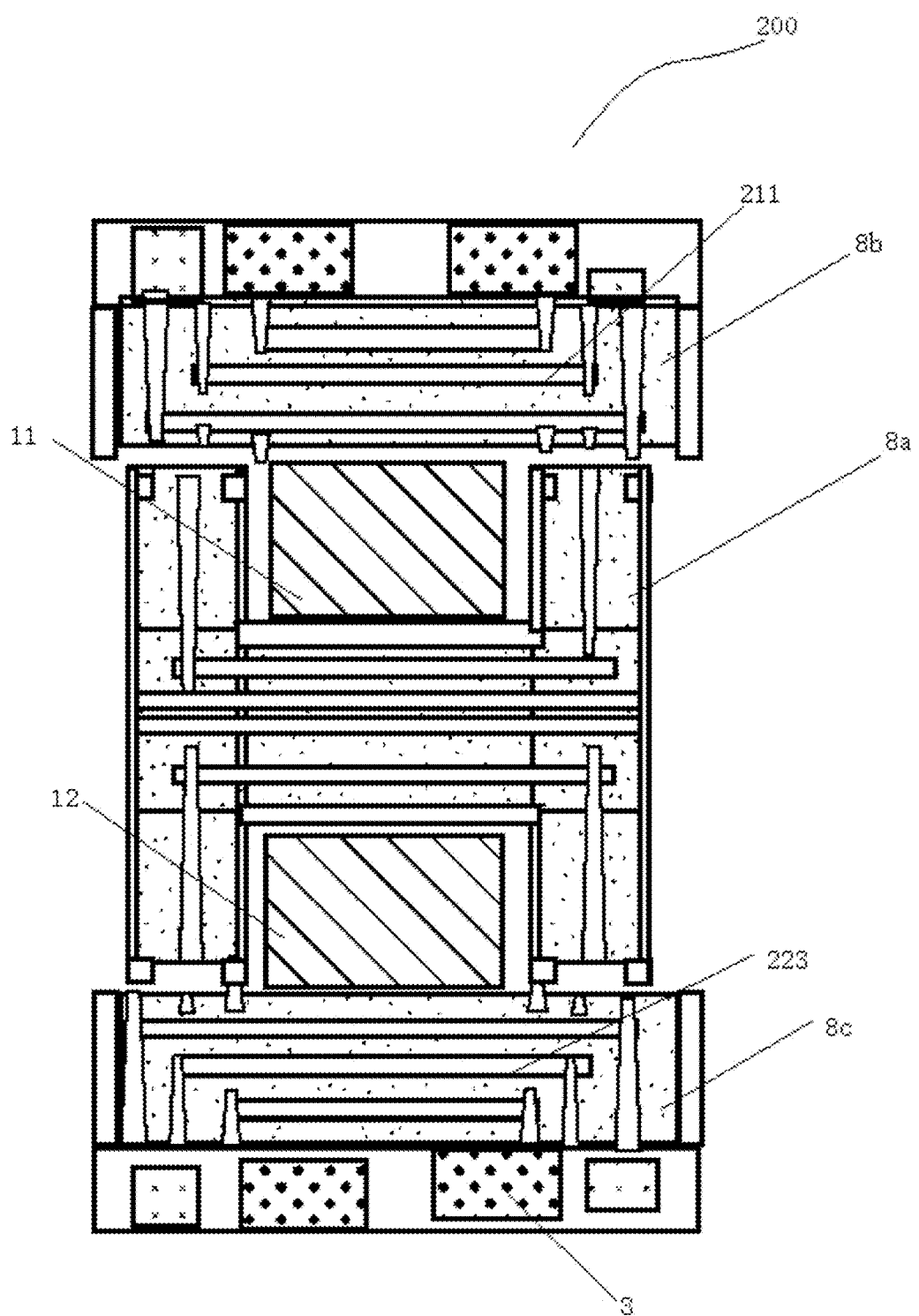
FIG. 11 is a schematic structural view of a power supply module in one embodiment of the disclosure.
Figure 12:
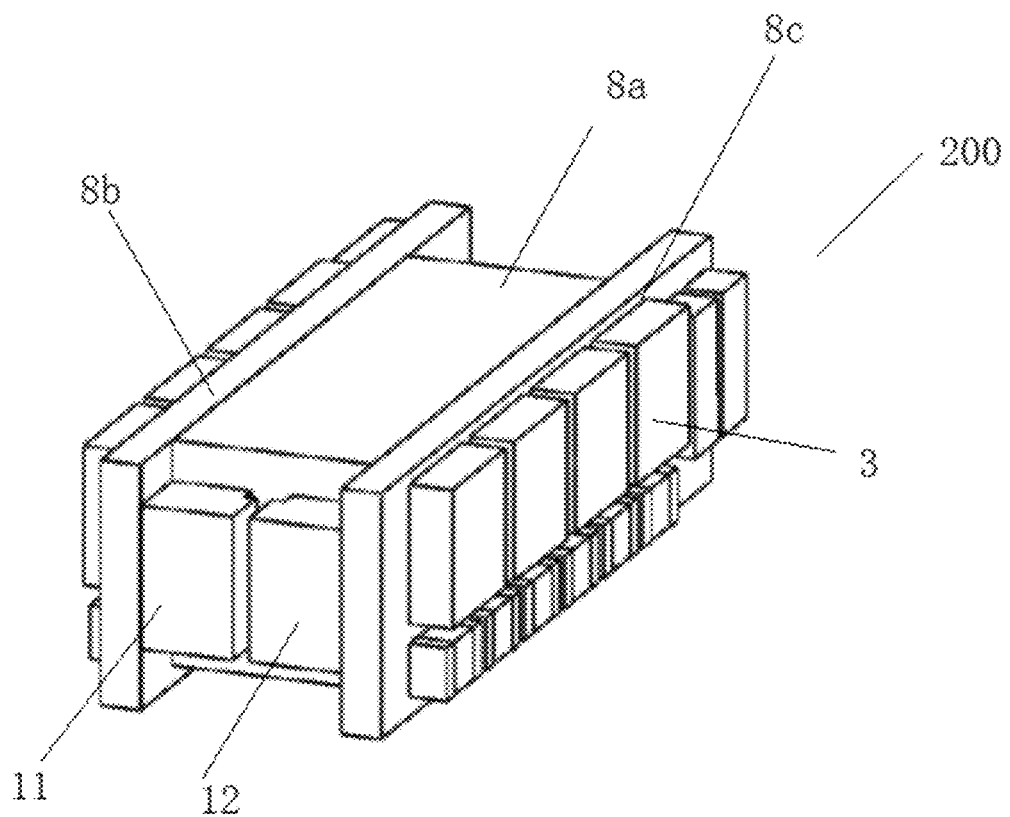
FIG. 12 is a perspective schematic structural view of the power supply module in one embodiment of the disclosure.

FIG. 11 is a schematic structural view of a power supply module in one embodiment of the disclosure, and FIG. 12 is a perspective schematic structural view of the power supply module in this embodiment. As shown in FIG. 11, the first power supply module 200 includes any one of the magnetic elements in the first to fourth embodiments, and at least one power switch 3 (maybe power switching device, power active device, such as MOS, or power IC) disposed above the first upper metal part 211 or below the first lower metal part 223. As shown in FIG. 12, the first upper metal part 211 is formed on or in a second substrate 8b, the first lower metal part 223 is formed on or in a third substrate 8c, and the power switches 3 are disposed on surfaces of the second substrate 8b and the third substrate 8c away from the magnetic columns. The structure of the power supply module in the application is symmetric with stresses, so the structure is reliable, simple and compact. Since there is no power switch or passive element stacked with the magnetic columns in a vertical direction, the magnetic columns can extend in a height direction, i.e., along an axis direction which the magnetic loop surrounds, such that the magnetic loop of the magnetic columns is balanced, thereby reducing loss of the magnetic flux. Since the power switches 3 are disposed on surfaces of the second substrate 8b and the third substrate 8c away from the magnetic columns, the structure is simple, the number of components is small, a power density is high, the process is simple, and cost is low.

Figure 13A:
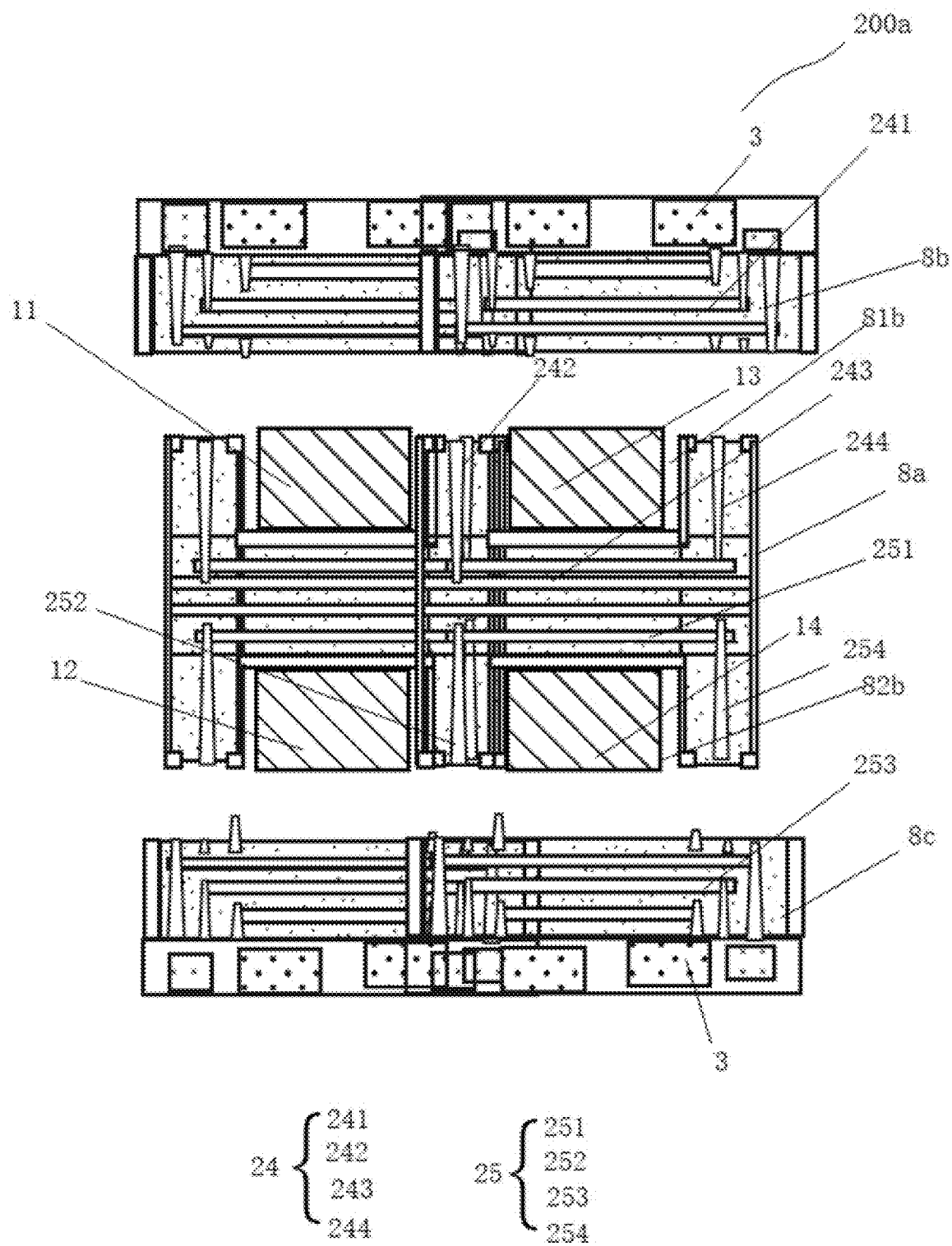
FIG. 13A is a schematic structural view (I) of a second power supply module in another embodiment of the disclosure.
Figure 13B:
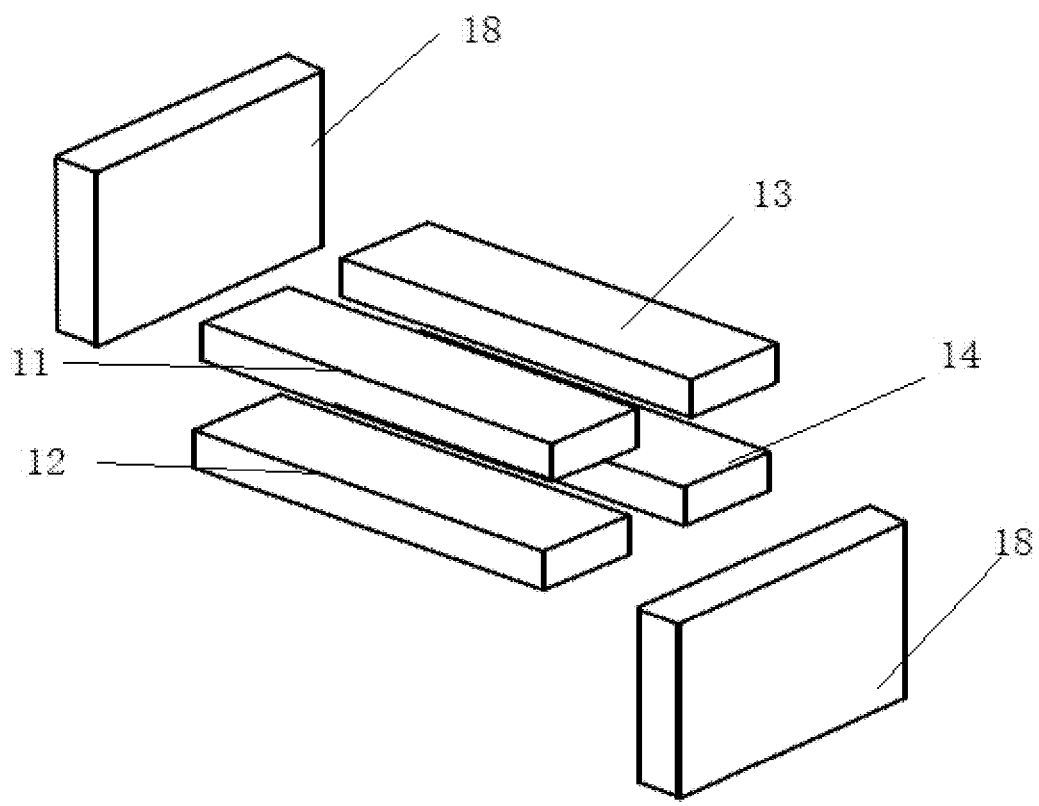
FIG. 13B is a perspective schematic structural view of a magnetic core arranged in a matrix of the power supply module in another embodiment of the disclosure.
Figure 14:
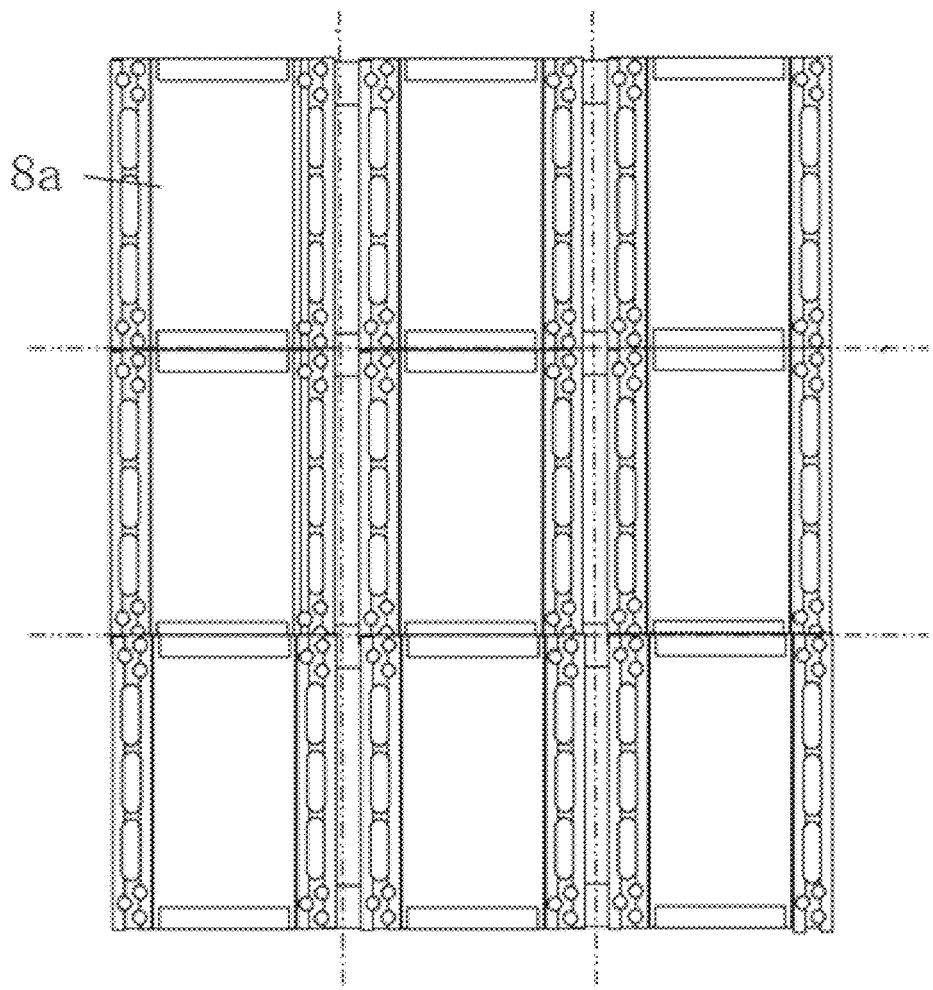
FIG. 14 is a schematic structural view of a panel first substrate manufactured by the way of a panel circuit board.

FIG. 13A is a schematic structural view of a power supply module in another embodiment of the disclosure, FIG. 13B is a perspective schematic structural view of a magnetic core arranged in a matrix of the power supply module in another embodiment of the disclosure, and FIG. 14 is a schematic structural view of a panel first substrate manufactured by the way of a panel circuit board. What is different from the power supply module shown in FIG. 11 is that the power supply module includes an array magnetic column. Referring to FIG. 13A, a magnetic element of the second power supply module 200a includes a first magnetic column 11, a second magnetic column 12, a third magnetic column 13, a fourth magnetic column 14, a first winding 21, a second winding 22, a fourth winding 24 and a fifth winding 25. The first winding and the second winding are the same as that in the first to fourth embodiments, and the details are not described here. The third magnetic column 13 and the fourth magnetic column 14 are stacked, the third magnetic column 13 is at right side of the first magnetic column 11, and the fourth magnetic column 14 is at right side of the second magnetic column 12. The fourth winding 24 is winded around the third magnetic column 13, and the fifth winding 25 is winded around the fourth magnetic column 14. The fourth winding 24 includes a third upper metal part 241, a fourth left metal part 242, a fourth middle metal part 243 and a fourth right metal part 244 sequentially connected. The third upper metal part 241 is above the third magnetic column 13, the fourth left metal part 242 is at left side of the third magnetic column 13, the fourth middle metal part 243 is between the third magnetic column 13 and the fourth magnetic column 14, and the fourth right metal part 244 is at right side of the third magnetic column 13. The fifth winding 25 includes a fifth middle metal part 251, a fifth left metal part 252, a second lower metal part 253 and a fifth right metal part 254 sequentially connected. The fifth middle metal part 251 is between the third magnetic column 13 and the fourth magnetic column 14, the fifth left metal part 252 is at left side of the fourth magnetic column 14, the second lower metal part 253 is below the fourth magnetic column 14, and the fifth right metal part 254 is at right side of the fourth magnetic column 14. The third upper metal part 241, the fourth left metal part 242, the fourth middle metal part 243 and the fourth right metal part 244, the fifth middle metal part 251, the fifth left metal part 252 and the fifth right metal part 254 are formed on or in the first substrate 8a.

The first substrate 8a further has a third upper groove 81b and a third lower groove 82b in which the third magnetic column 13 and the fourth magnetic column 14 are disposed respectively. The first substrate 8a may be manufactured in a panel way. Referring to FIG. 14, FIG. 14 is a schematic structural view of a panel including a plurality of the first substrates. The panel is arranged in a n×n (where n=3 in FIG. 14) array. After manufacturing, the panel is cut into an integrated first substrate 8a shown in FIG. 13A.

Moreover, in this embodiment, referring to FIG. 13A, the third upper metal part 241 may be formed on or in the second substrate 8b, and the second lower metal part 253 is formed on or in the third substrate 8c. The power switches 3 can be disposed on an upper surface of the second substrate 8b, and a lower surface of the third substrate 8c.

As shown in FIG. 13B, both ends of the first magnetic column 11, the second magnetic column 12, the third magnetic column 13 and the fourth magnetic column 14 are connected to form a magnetic loop through the magnetic cover 18. Using an array structure, power of the power supply module can be increased, and efficiency can be improved by multiplexing of the magnetic loop. It is also possible to multiplex the circuit, thereby further improving efficiency, or facilitating arrangement of switch devices, in particular, the secondary rectifier devices, and reducing a length and loss of the winding. Moreover, the power supply module with an array structure is more compact and simpler, and has a higher power density.

In the aforementioned embodiments, the first magnetic column 11, the second magnetic column 12, the third magnetic column 13 and the fourth magnetic column are all rectangular.

FIGS. 15a-15f are manufacturing flows of one power supply module according to the disclosure, and only illustrate manufacturing flows of the power supply module using the magnetic element in the first embodiment. Referring to FIG. 15a, FIG. 15a shows step S1, providing a first substrate 8a, and disposing a first upper groove 81 and a first lower groove 82 on upper and lower surfaces of the first substrate 8a.

FIG. 15b shows step S2, placing the first magnetic column 11 and the second magnetic column 12 in the first upper groove 81 and the first lower groove 82, respectively. Specifically, dispensing glue in the first upper groove 81 and the first lower groove 82, and then sequentially place the first magnetic column 11 and the second magnetic column 12, such that the first magnetic column 11 and the second magnetic column 12 are fixed in the first upper groove 81 and the first lower groove 82, respectively.

Step S3 may be performed simultaneously with step S2. In step S3, power elements, such as, switching devices or passive elements, can be soldered onto surface of the third substrate 8c away from the grooves, for example, using surface mounting technology (SMT) and reflow soldering. If it is for manufacturing a magnetic element, the step S3 can be omitted.

FIG. 15e shows step S4, disposing the second substrate 8b and the third substrate 8c soldered with power elements on the first substrate 8a with the magnetic columns to form a complete first winding 21 and a complete second winding 22.

FIG. 15e also shows cutting a plurality of power supply modules formed in a panel into a separate power supply module. Both ends of the second substrate 8b and the third substrate 8c are provided with conductive vias, and an optimal cutting line (a dashed line in FIG. 15e) is along the conductive vias of the second substrate 8b and the third substrate 8c. As shown in FIG. 15f, after cutting along the cutting line, a plurality of pins 48, such as, pads, of the power supply module can be formed on a left end surface of the second substrate 8b and the third substrate 8c or a right end surface of the second substrate 8b and the third substrate 8c.

In the step S1, a panel with a plurality of first substrate can be provided. Referring to FIG. 14, FIG. 14 is a schematic structural view of the panel with a plurality of first substrates, and the panel is arranged in a 3×3 array. After manufacturing, the panel is cut along the cutting line (the dashed line in the figure), and nine first substrates 8a can be formed. Production in the panel way can largely improve manufacturing efficiency of the substrate, and reduce cost. It shall be noted that preferably, the grooves on two surfaces of the first substrate 8a are in a symmetric state, and the first upper groove 81 and the first lower groove 82 are completely symmetric at both sides of the first substrate 8a, thereby balancing stress inside the first substrate 8a, reducing deformation of the first substrate 8a when temperature changes, and improving reliability of the transformer module or the power supply module, or stability of the process.

Figure 16A:
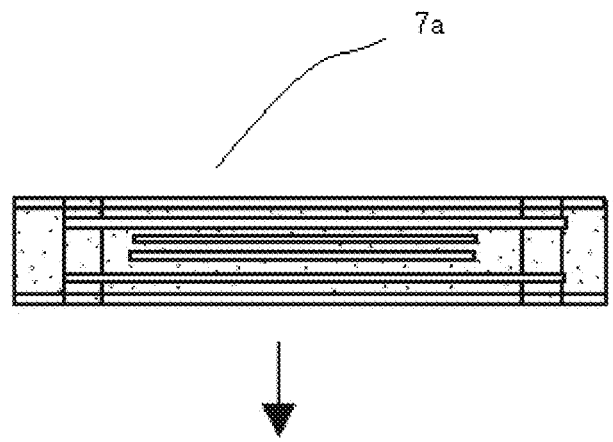
FIGS. 16a-16d are manufacturing flows of the first substrate according to the disclosure.

FIGS. 16a-16d are manufacturing flows of the first substrate according to the disclosure. Referring to FIG. 16a, FIG. 16a shows step S11, providing a first circuit board 7a provided with metal parts for the windings.

Figure 16B:
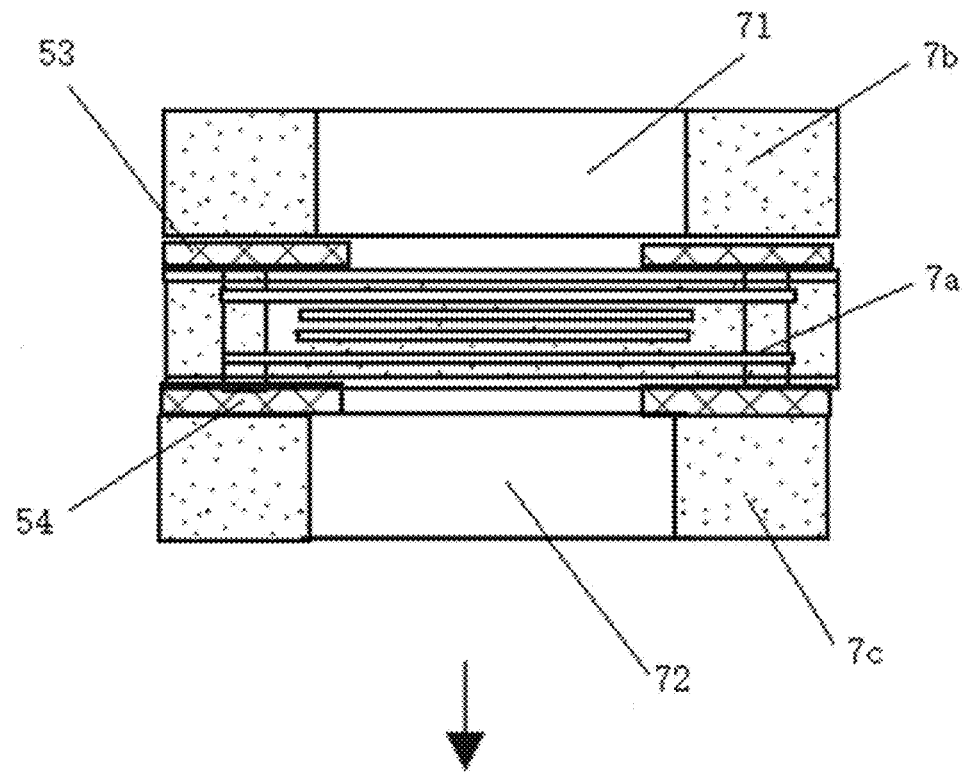

FIG. 16b shows step S12, providing a second circuit board 7b provided with a first through hole 71, and a third circuit board 7c provided with a second through hole 72. The second circuit board 7b is adhered to an upper surface of the first circuit board 7a through a third bonding layer 53, and the third circuit board 7c is adhered to a lower surface of the first circuit board 7a through a fourth bonding layer 54. The second circuit board 7b with the first through hole 71 is stacked on the upper surface of the first circuit board 7a, and the third circuit board 7c with the second through hole 72 is bonded to the lower surface of the first circuit board 7a, such that a first upper groove 81 and a first lower groove 82 are formed on the upper and lower surfaces of the first circuit board 7a, respectively.

Figure 16C:
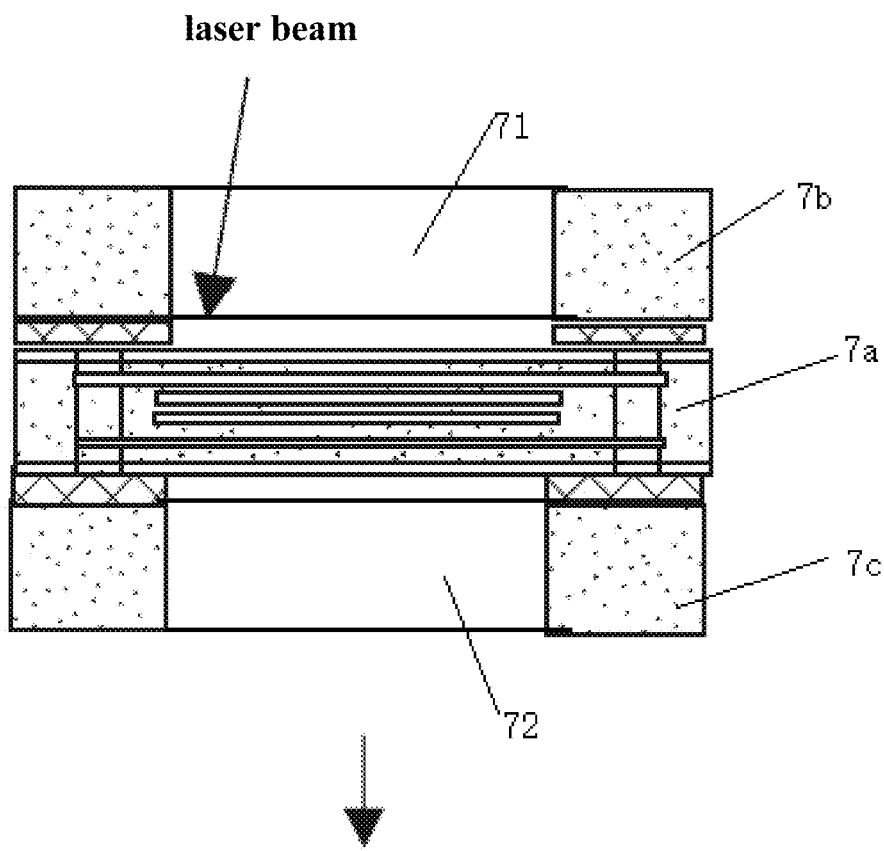

FIG. 16c shows step S13, adjusting structures of the upper and lower grooves of the first circuit board 7a using a laser beam, for example, removing the extruded bonding layer.

Figure 16D:
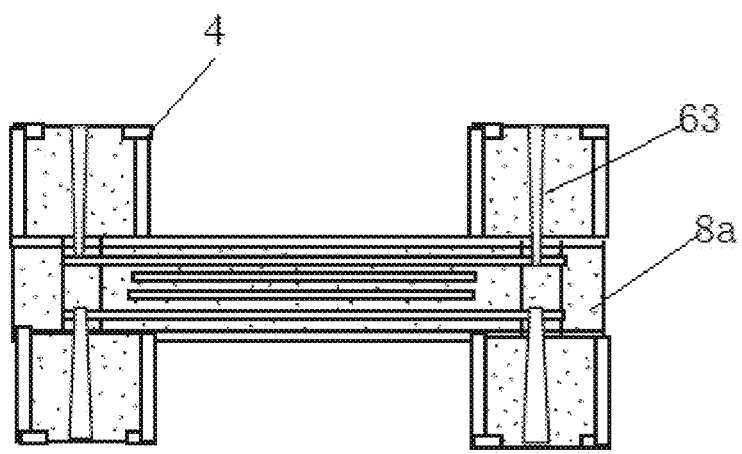

FIG. 16d shows step S14. In the step S14, a plurality of conductive vias 63 are manufactured. Pads 4 are formed on an end surface of the second circuit board 7b to be electrically connected to corresponding wiring layer inside.

Through the aforementioned steps, the second circuit board 7b and the third circuit board 7c with the through holes are stacked on the upper and lower surface of the first circuit board 7a, such that depths of the grooves can be increased easier, thereby increasing a sectional area of the magnetic columns, and improving efficiency.

In some other embodiments, the first substrate can also be formed by grooving on upper and lower surfaces of a fourth circuit board.

Figure 17A:
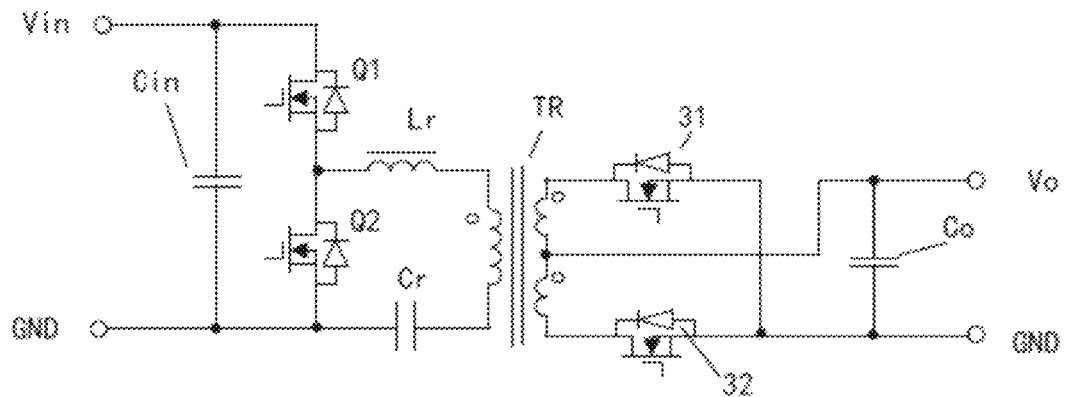
FIG. 17a shows a half-bridge LLC circuit.
Figure 17B:
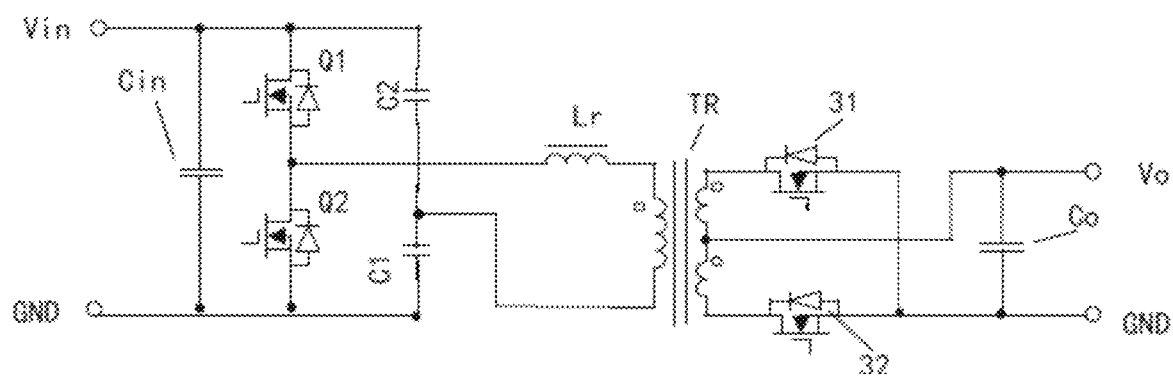
FIG. 17b shows another type of half-bridge LLC circuit.
Figure 17C:
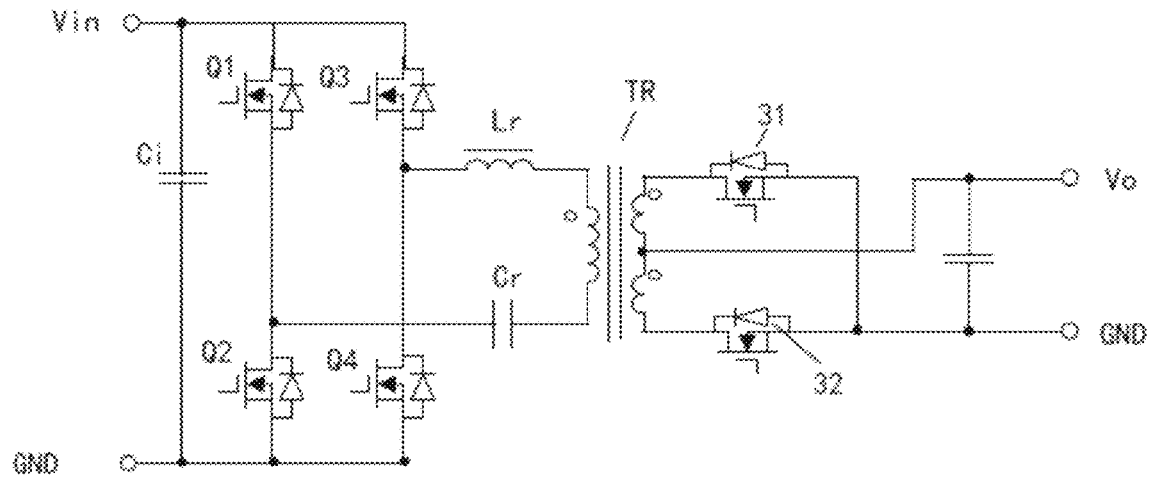
FIG. 17c shows a full bridge LLC circuit.
Figure 17D:
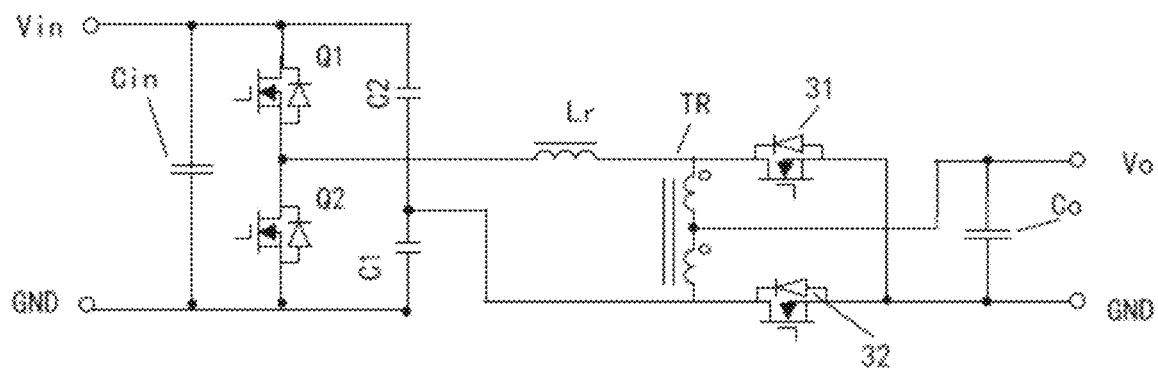
FIG. 17d shows an LLC circuit with an autotransformer.

FIGS. 17a to 17d illustrate some typical application circuits of the power supply module provided in the application, but the disclosure is not limited thereto. FIG. 17a illustrates a half-bridge LLC circuit, FIG. 17b illustrates another type of half-bridge LLC circuit, FIG. 17c illustrates a full bridge LLC circuit, and FIG. 17d illustrates an LLC circuit with an autotransformer. In the figures, 31 to 32 are rectifying elements, Q1 to Q4 are switching devices of a primary bridge circuit, TR is a transformer (a magnetic element), Co is an output capacitor, Cin is an input capacitor, Lr is a resonant inductor, and Cr is a resonant capacitor. Vin is an input voltage, Vo is an output positive electrode, and GND is an output negative electrode.

In addition, the structure of the disclosure can also be applied to a Cuk circuit or a flyback circuit.

Although the disclosure has been disclosed in the embodiments, the disclosure is not limited thereto. Any skilled in the art shall make slight changes and modifications without departing from spirit and scope of the disclosure, so the protection scope of the disclosure shall be determined by the scope defined by the appended claims.

What is claimed is:

1. A magnetic element, comprising:
    a magnetic core, comprising:
        a first magnetic column;
        a second magnetic column below the first magnetic column;
    a first winding, comprising:
        a first upper metal part above the first magnetic column;
        a first left metal part at left side of the first magnetic column;
        a first middle metal part between the first magnetic column and the second magnetic column; and
        a first right metal part at right side of the first magnetic column, the first upper metal part, the first left metal part, the first middle metal part and the first right metal part are sequentially connected; and
    a second winding, comprising:
        a second middle metal part between the first magnetic column and the second magnetic column;
        a second left metal part at left side of the second magnetic column;
        a first lower metal part below the second magnetic column; and
        a second right metal part at right side of the second magnetic column, the second middle metal part, the second left metal part, the first lower metal part and the second right metal part are sequentially connected,
    wherein the first left metal part, the first middle metal part, the first right metal part, the second middle metal part, the second left metal part and the second right metal part are formed on or in a first substrate, the first substrate has a first upper groove and a first lower groove in which the first magnetic column and the second magnetic column are disposed respectively.

2. The magnetic element according to claim 1, wherein the first upper metal part is formed on or in a second substrate, and the first lower metal part is formed on or in a third substrate.

3. The magnetic element according to claim 2, wherein the first substrate, the second substrate and the third substrate are printed circuit boards.

4. The magnetic element according to claim 1, wherein the first left metal part, the first right metal part, the second left metal part and the second right metal part are conductive vias.

5. The magnetic element according to claim 1, wherein a surface of the first upper groove is electroplated with a metal.

6. The magnetic element according to claim 3, wherein the second substrate comprises:
    a first wiring layer disposed above the first magnetic column; and
    a second wiring layer disposed above the first wiring layer, wherein a part of the first upper metal part is on the first wiring layer, and the rest part of the first upper metal part is on the second wiring layer.

7. The magnetic element according to claim 6, further comprising a third winding, the third winding comprising:
    a second upper metal part above the first magnetic column;
    a third left metal part at left side of the first magnetic column;
    a third middle metal part between the first magnetic column and the second magnetic column; and
    a third right metal part at right side of the first magnetic column, the second upper metal part, the third left metal part, the third middle metal part and the third right metal part are sequentially connected,
    wherein a part of the second upper metal part is on the first wiring layer, and the rest part of the second upper metal part is on the second wiring layer.

8. The magnetic element according to claim 1, wherein the magnetic core further comprises a first magnetic cover, a second magnetic cover, a third magnetic cover and a fourth magnetic cover, wherein the first magnetic cover and the second magnetic cover are disposed on a front surface and a rear surface of the first magnetic column, the third magnetic cover and the fourth magnetic cover are disposed on a front surface and a rear surface of the second magnetic column, end surfaces of the first magnetic cover, the second magnetic cover, the third magnetic cover and the fourth magnetic cover are inclined, an inclined first air gap is formed between the first magnetic cover and the third magnetic cover, and an inclined second air gap is formed between the second magnetic cover and the fourth magnetic cover.

9. The magnetic element according to claim 1, wherein the first upper metal part and the first lower metal part are realized by metallization.

10. The magnetic element according to claim 3, further comprising a first bonding layer between the second substrate and the first substrate, and a second bonding layer between the third substrate and the first substrate.

11. The magnetic element according to claim 10, wherein the first bonding layer is disposed outside a notch of the first upper groove, and the second bonding layer is disposed outside a notch of the first lower groove.

12. The magnetic element according to claim 3, wherein the second substrate has a second lower groove having a notch facing downward, the third substrate has a second upper groove having a notch facing upward, the second lower groove and the first upper groove are enclosed to form a first accommodation chamber for accommodating the first magnetic column, and the second upper groove and the first lower groove are enclosed to form a second accommodation chamber for accommodating the second magnetic column.

13. The magnetic element according to claim 1, wherein the magnetic core further comprises a third magnetic column and a fourth magnetic column stacked, the third magnetic column is at right side of the first magnetic column, and the fourth magnetic column is at right side of the second magnetic column; the magnetic element further comprises:
    a fourth winding, comprising:
        a third upper metal part above the third magnetic column;
        a fourth left metal part at left side of the third magnetic column;
        a fourth middle metal part between the third magnetic column and the fourth magnetic column; and a fourth right metal part at right side of the third magnetic column, the third upper metal part, the fourth left metal part, the fourth middle metal part and the fourth right metal part are sequentially connected; and a fifth winding, comprising:
- a fifth middle metal part between the third magnetic column and the fourth magnetic column;
- a fifth left metal part at left side of the fourth magnetic column;
- a second lower metal part below the fourth magnetic column; and
- a fifth right metal part at right side of the fourth magnetic column, the fifth middle metal part, the fifth left metal part, the second lower metal part and the fifth right metal part are sequentially connected, wherein the fourth left metal part, the fourth middle metal part, the fourth right metal part, the fifth middle metal part, the fifth left metal part and the fifth right metal part are formed on or in the first substrate, the first substrate further has a third upper groove and a third lower groove in which the third magnetic column and the fourth magnetic column are disposed respectively.

14. The magnetic element according to claim 1, further comprising a sixth winding, the sixth winding comprising:
- a fourth upper metal part above the first magnetic column;
- a sixth left metal part at left side of the first magnetic column;
- a sixth middle metal part between the first magnetic column and the second magnetic column; and
- a sixth right metal part at right side of the first magnetic column, the sixth left metal part, the sixth middle metal part and the sixth right metal part formed on or in the first substrate, and the fourth upper metal part, the sixth left metal part, the sixth middle metal part and the sixth right metal part are sequentially connected, wherein the first winding is used as a primary winding of the magnetic element, and the sixth winding is used as a first secondary winding of the magnetic element.

15. The magnetic element according to claim 14, further comprising a seventh winding, the seventh winding comprising:
- a fifth upper metal part above the first magnetic column;
- a seventh left metal part at left side of the first magnetic column;
- a seventh middle metal part between the first magnetic column and the right magnetic column; and
- a seventh right metal part at right side of the first magnetic column, the seventh left metal part, the seventh middle metal part and the seventh right metal part formed on or in the first substrate, and the fifth upper metal part, the seventh left metal part, the seventh middle metal part and the seventh right metal part are sequentially connected, wherein the seventh winding is used as a second secondary winding of the magnetic element, and at least a part of the primary winding is between at least a part of the first secondary winding and at least a part of the second secondary winding.

16. The magnetic element according to claim 1, wherein the first substrate is formed by arranging a second circuit board with a first through hole and a third circuit board with a second through hole on upper and lower surfaces of a first circuit board, or the first substrate is formed by grooving on upper and lower surfaces of a fourth circuit board.

17. The magnetic element according to claim 2, further comprising a plurality of pins disposed on a first end surface of the second substrate and a first end surface of the third substrate, and the first end surface of the second substrate and the first end surface of the third substrate are coplanar.

18. The magnetic element according to claim 2, wherein the second substrate and the third substrate are electrically connected to the first substrate through a plurality of conductive vias.

19. The magnetic element according to claim 17, wherein the second substrate and the third substrate are bonded to both sides of the first substrate respectively through bonding layers.

20. A power supply module, comprising the magnetic element according to claim 1, and further comprising at least one power switch disposed above the first upper metal part or below the first lower metal part.

21. The power supply module according to claim 20, further comprising a plurality of pins, wherein the first upper metal part is formed on or in a second substrate, the first lower metal part is formed on or in a third substrate, and the plurality of pins are disposed on left end surfaces of the second substrate and the third substrate, or right end surfaces of the second substrate and the third substrate.

* * * * *